(12) United States Patent
Jeon et al.

(10) Patent No.: US 12,745,629 B2
(45) Date of Patent: Sep. 22, 2026

(54) ELECTRONIC DEVICES AND METHODS OF MANUFACTURING ELECTRONIC DEVICES

(71) Applicant: Amkor Technology Singapore Holding Pte. Ltd., Valley Point (SG)

(72) Inventors: Yu Jin Jeon, Incheon (KR); Dong Hyeon Park, Seoul (KR); Ji Young Jeong, Gyeonggi-do (KR); Young Jun Koo, Incheon (KR); Dong Su Ryu, Incheon (KR)

(73) Assignee: Amkor Technology Singapore Holding Pte. Ltd., Singapore (SG)

(*) Notice: Subject to any disclaimer, the term of this patent is extended or adjusted under 35 U.S.C. 154(b) by 435 days.

(21) Appl. No.: 18/244,248

(22) Filed: Sep. 9, 2023

(65) Prior Publication Data

US 2025/0087549 A1 Mar. 13, 2025

(51) Int. Cl.
*H10W 40/22* (2026.01)
*H10W 40/00* (2026.01)
(Continued)

(52) U.S. Cl.
CPC ......... *H10W 40/22* (2026.01); *H10W 40/037* (2026.01); *H10W 72/073* (2026.01);
(Continued)

(58) Field of Classification Search
CPC ..... H01L 24/83; H01L 21/4882; H01L 24/29; H01L 24/32; H01L 23/3675; H01L 24/26; H01L 24/16; H01L 24/13; H01L 23/373; H01L 23/3121; H01L 21/6835; H01L 23/4334; H01L 25/50; H01L 23/31; H01L 23/367; H01L 23/3677; H01L 25/0652; H01L 23/49811; H01L 23/42; H01L 23/3737; H01L 23/10; H01L 23/36; H01L 23/04; H01L 23/49827; H01L 23/3735; H01L 25/0657; H01L 23/49822; H01L 2224/33505; H01L 2224/83191; H01L 2924/0675; H01L 2224/26175;
(Continued)

(56) References Cited

U.S. PATENT DOCUMENTS

2015/0035134 A1* 2/2015 Hung .................. H01L 23/3672 257/712
2015/0035135 A1* 2/2015 Hung .................. H01L 25/0657 257/712
(Continued)

*Primary Examiner* — Mouloucoulaye Inoussa
(74) *Attorney, Agent, or Firm* — Kevin B. Jackson

(57) ABSTRACT

In one example, an electronic device includes a substrate including a substrate first side, a substrate second side, and a conductive structure. An electronic component includes a component first side coupled to the conductive structure at the substrate first side, a component second side, and a component lateral side connecting the component first side to the component second side. A lid structure includes a first lid having a first lid side wall coupled to the substrate and a first lid top coupled to the first lid side wall and an opening over the component second side. The lid structure includes second lid with a second lid top coupled to the first lid top and a lid channel coupled to the opening. A thermal interface material is within the opening and covers at least a portion of the component second side. Other examples and related methods are also disclosed herein.

20 Claims, 14 Drawing Sheets

(51) Int. Cl.
*H10W 72/00* (2026.01)
*H10W 72/20* (2026.01)
*H10W 72/30* (2026.01)
*H10W 74/15* (2026.01)
*H10W 90/00* (2026.01)

(52) U.S. Cl.
CPC *H10W 72/07302* (2026.01); *H10W 72/07331* (2026.01); *H10W 72/07353* (2026.01); *H10W 72/07354* (2026.01); *H10W 72/07355* (2026.01); *H10W 72/252* (2026.01); *H10W 72/331* (2026.01); *H10W 72/334* (2026.01); *H10W 72/347* (2026.01); *H10W 72/352* (2026.01); *H10W 72/354* (2026.01); *H10W 72/357* (2026.01); *H10W 72/387* (2026.01); *H10W 72/877* (2026.01); *H10W 74/15* (2026.01); *H10W 90/734* (2026.01); *H10W 90/736* (2026.01)

(58) Field of Classification Search
CPC ... H01L 2924/0695; H01L 2224/83193; H01L 2924/0665; H01L 2224/13184; H01L 2924/069; H01L 2224/13155; H01L 2224/13166; H01L 2224/13147; H01L 2224/13111; H01L 2224/26145; H01L 2224/29111; H01L 2224/32225; H01L 2224/83007; H01L 2221/68345; H01L 2221/68359; H01L 2224/92125; H01L 2224/33181; H01L 2224/81815; H01L 2924/19043; H01L 2924/181; H01L 2924/19105; H01L 2224/2919; H01L 2224/29294; H01L 2924/1432; H01L 2924/19042
See application file for complete search history.

(56) References Cited

U.S. PATENT DOCUMENTS

| | | | | |
|---|---|---|---|---|
| 2016/0133602 | A1* | 5/2016 | Chen | H01L 23/42 438/107 |
| 2021/0118764 | A1* | 4/2021 | Lin | H01L 25/105 |
| 2021/0287956 | A1* | 9/2021 | Hung | H01L 23/10 |
| 2022/0328376 | A1* | 10/2022 | Kwon | H01L 23/49816 |
| 2022/0375813 | A1* | 11/2022 | Huang | H01L 23/42 |
| 2023/0021005 | A1* | 1/2023 | Chiou | H01L 23/5385 |
| 2023/0059983 | A1* | 2/2023 | Lin | H01L 21/52 |
| 2023/0093924 | A1* | 3/2023 | Shah | H01L 23/3675 257/692 |
| 2024/0038617 | A1* | 2/2024 | Hung | H01L 23/3737 |
| 2024/0105530 | A1* | 3/2024 | Hung | H01L 23/42 |
| 2024/0178095 | A1* | 5/2024 | Hung | H01L 24/32 |
| 2025/0372475 | A1* | 12/2025 | Wang | H01L 23/3675 |

* cited by examiner 100
150
152
120
123
180
110'
130
111
151
153
140
112
113
110
114
124
161
124b
160
162
115
124a
154
110'
121
122

170
A'
160
B
B'
A 121
122
110'
110
124a
124b
124
114
113
112
111
130
123
120

115
153
151
150a
150b
152
150

160
161
162
155
154
110'
115
110
140
153
151
150
150a
150b
152
120
123
130
111
112
113
114
124
124a
124b
121
122

150b
150a
153
150'''

150b
3Cb
3Cb'
153
150a
155c''
155a''
155''
155b''
150''

150b
3Ca
3Ca'
153
150a
155a'
155'
155b'
150'

170
171
121
122
110'
255
162
115
160
124a
161
124b
124
110
114
113
112
240
111
130
253
252
110'
180
123
200
250a
250bb
250ba
252
120
250b
250

ELECTRONIC DEVICES AND METHODS OF MANUFACTURING ELECTRONIC DEVICES

CROSS-REFERENCE TO RELATED APPLICATIONS

Not applicable.

TECHNICAL FIELD

The present disclosure relates, in general, to electronic devices, and more particularly, to electronic devices and methods for manufacturing electronic devices.

BACKGROUND

Prior electronic packages and methods for forming electronic packages are inadequate, resulting, for example, in excess cost, decreased reliability, relatively low performance, or package sizes that are too large. Further limitations and disadvantages of conventional and traditional approaches will become apparent to one of skill in the art, through comparison of such approaches with the present disclosure and reference to the drawings.

BRIEF DESCRIPTION OF THE DRAWINGS

FIGS. 3Ba, 3Bb, and 3Bc show top plan views of other example first lids.

FIG. 3Ca is a cross-sectional view taken along reference 3Ca-3Ca' of FIG. 3Ba.

FIG. 3Cb is a cross-sectional view taken along reference line 3Cb-3Cb' of FIG. 3Bb.

FIG. 6Ba shows a top plan view of another example first lid.

Figure 1A:
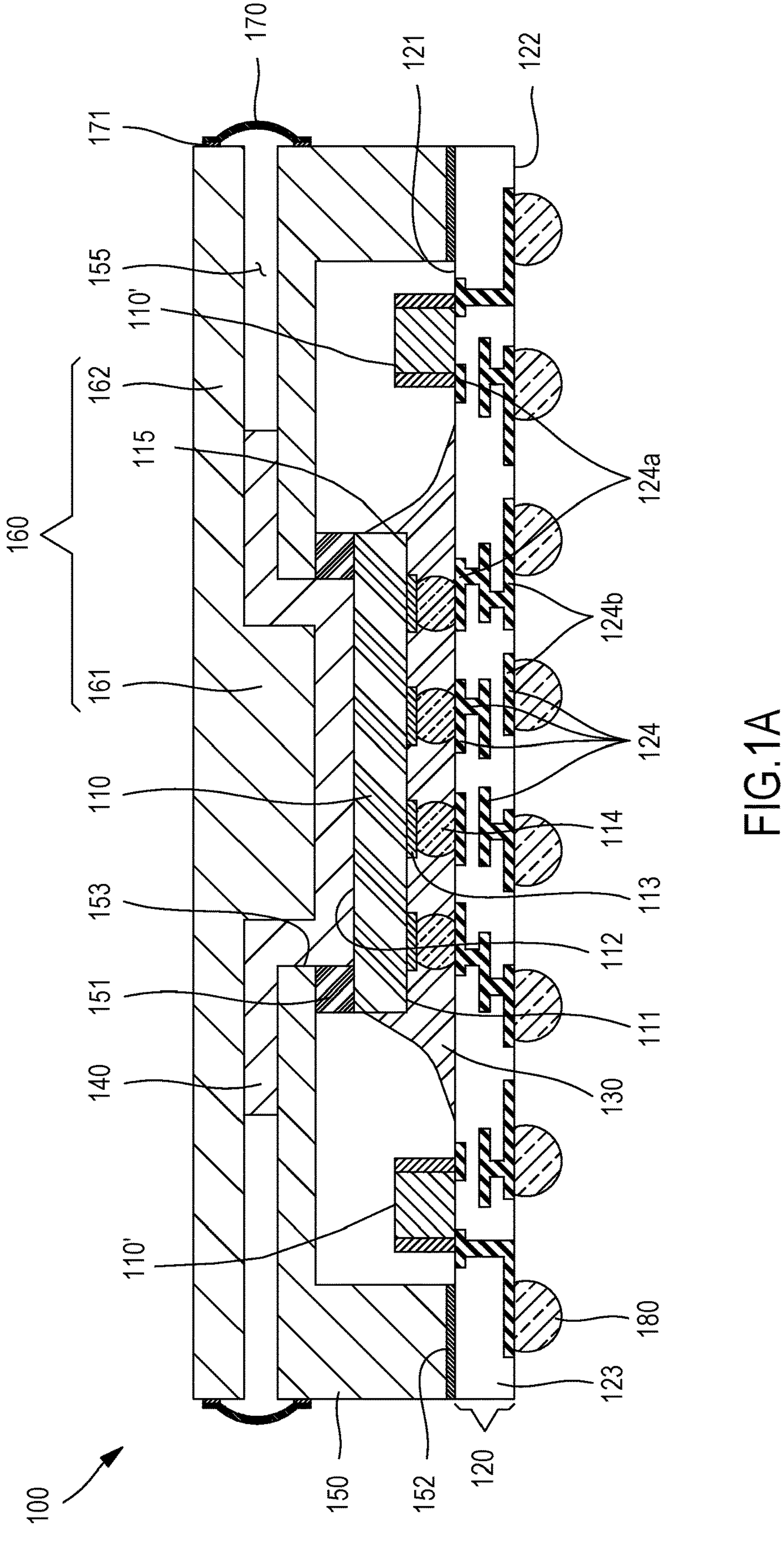
FIGS. 1A and 1B show cross-sectional views of an example electronic device.

The following discussion provides various examples of electronic devices and methods of manufacturing electronic devices. Such examples are non-limiting, and the scope of the appended claims should not be limited to the particular examples disclosed. In the following discussion, the terms "example" and "e.g." are non-limiting.

The figures illustrate the general manner of construction, and descriptions and details of well-known features and techniques may be omitted to avoid unnecessarily obscuring the present disclosure. In addition, elements in the drawing figures are not necessarily drawn to scale. For example, the dimensions of some of the elements in the figures may be exaggerated relative to other elements to help improve understanding of the examples discussed in the present disclosure. The same reference numerals in different figures denote the same elements.

The term "or" means any one or more of the items in the list joined by "or." As an example, "x or y" means any element of the three-element set {(x), (y), (x, y)}. As another example, "x, y, or z" means any element of the seven-element set {(x), (y), (z), (x, y), (x, z), (y, z), (x, y, z)}.

The terms "comprises," "comprising," "includes," or "including" are "open ended" terms and specify the presence of stated features, but do not preclude the presence or addition of one or more other features.

The terms "first," "second," etc. may be used herein to describe various elements, and these elements should not be limited by these terms. These terms are only used to distinguish one element from another. Thus, for example, a first element discussed in this disclosure could be termed a second element without departing from the teachings of the present disclosure.

Unless specified otherwise, the term "coupled" may be used to describe two elements directly contacting each other or describe two elements indirectly coupled by one or more other elements. For example, if element A is coupled to element B, then element A can be directly contacting element B or indirectly coupled to element B by an intervening element C. Similarly, the terms "over" or "on" may be used to describe two elements directly contacting each other or describe two elements indirectly coupled by one or more other elements. As used herein, the term "coupled" can refer to an electrical coupling or a mechanical coupling.

DESCRIPTION

The present description includes, among other features, structures and associated methods that relate to electronic devices with heat dissipation structures. More particularly, structures and methods are described that improve the reliability of electronic devices that reduce defects associated with thermal stress, such as warpage or package distortion or bending. In some examples, a multi-piece lid structure is used with a thermal interface material to enhance heat dissipation away from an electronic component. In some examples, the thermal interface material comprises a liquid. In some examples, the lid structure defines a space or cavity proximate to the electronic component for containing the thermal interface material. In some examples, the lid structure comprises a channel structure that is in communication with the cavity. The channel structure and cavity can be configured to control flow or expansion of the thermal interface material during a stress event, such as thermal stressing. In this way, stresses induced on the electronic device are reduced. This is an improvement over prior electronic devices that use, for example, solid metal sheet-type thermal interface materials, which can delaminate from the electronic component because of thermal stress.

In some examples, the lid structure can be configured to confine the thermal interface material adjacent to a major side of the electronic component. In some examples, the lid structure can be configured to provide thermal interface material further adjacent to a lateral side of the electronic component. In some examples, the channel structure can be sealed to confine the thermal interface material to within the electronic device. In some examples, the lid structure can be configured to reduce the formation of or presence of voiding in the electronic device further improving reliability.

In an example, an electronic device includes a substrate including a substrate first side, a substrate second side opposite to the substrate first side, and a conductive structure. A first electronic component includes a component first side coupled to the conductive structure at the substrate first side, a component second side opposite to the component first side, and a component lateral side connecting the component first side to the component second side. A lid structure includes a first lid having a first lid side wall coupled to the substrate and a first lid top coupled to the first lid side wall and having an opening over the component second side; a second lid having a second lid top coupled to the first lid top; and a lid channel coupled to the opening. A thermal interface material is within the opening and covers at least a portion of the component second side.

In an example, an electronic device includes a substrate with a substrate first side, a substrate second side opposite to the substrate first side, and a conductive structure. A first electronic component includes a component first side coupled to the conductive structure at the substrate first side, a component second side opposite to the component first side, and a component lateral side connecting the component first side to the component second side. A first lid is coupled to the substrate first side and includes a first lid top including an opening. A second lid with a second lid top is coupled to the first lid top. A lid channel is in one or more of the first lid or the second lid. A thermal interface material within the opening.

In an example, a method of manufacturing an electronic device includes providing a substrate including a substrate first side, a substrate second side opposite to the substrate first side, and a conductive structure. The method includes providing a first electronic component including a component first side coupled to the conductive structure at the substrate first side, a component second side opposite to the component first side, and a component lateral side connecting the component first side to the component second side. The method includes providing a first lid coupled to the substrate first side and including a first lid top having an opening. The method includes providing a second lid comprising a second lid top coupled to the first lid top. The method includes providing a lid channel in one or more of the first lid or the second lid. The method includes providing a thermal interface material within the opening.

Other examples are included in the present disclosure. Such examples may be found in the figures, in the claims, or in the description of the present disclosure.

Figures 1B, 1C:
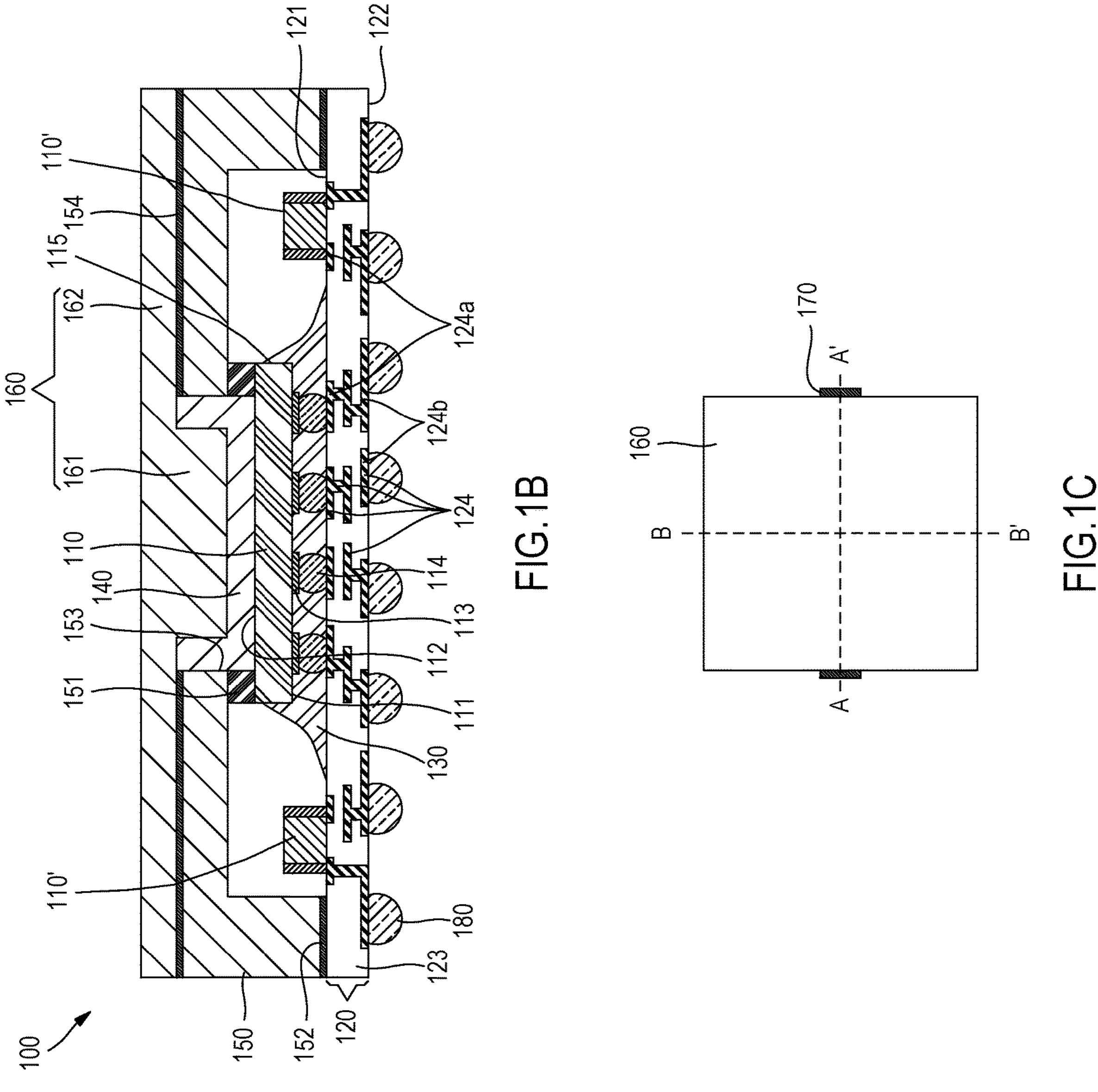
FIG. 1C shows a top view of an example electronic device.

FIGS. 1A and 1B show cross-sectional views of an example electronic device 100. FIG. 1C shows a top view of electronic device 100. FIG. 1A is a cross-sectional view taken along line A-A' in FIG. 1C, FIG. 1B is a cross-sectional view taken along line B-B' in FIG. 1C.

In the example shown in FIGS. 1A, 1B, and 1C, electronic device 100 can comprise an electronic component 110, a substrate 120, an underfill 130, a thermal interface material (TIM) 140, a lid 150, a lid 160, a closing member 170, and an external interconnect 180. In some examples, electronic device 100 can also comprise one or more electronic component(s) 110'.

Electronic component 110 can comprise a first side 111, a second side 112 opposite to first side 111, and a lateral side 115 connecting first side 111 to second side 112. In some examples, first side 111 of electronic component 110 can comprise or be referred to as an active side where circuit elements can be formed, and second side 112 of electronic component 110 can comprise or be referred to as an inactive side. First side 111 can also be referred to as or comprise a component first side and second side 112 can also be referred to or comprises a component second side opposite to the component first side. In some examples, electronic component 110 can comprise contact pads 113 proximate to first side 111, which can be coupled to the circuit elements within or on electronic component 110. Substrate 120 can comprise a first side 121 and a second side 122 opposite to first side 121. First side 121 of substrate 120 can also be referred to as a substrate first side, substrate top side, or a substrate inner side, and second side 122 of substrate 120 can be referred to as a substrate second side, substrate bottom side, or a substrate outer side. In the present example, first side 111 of electronic component 110 is proximate to first side 121 of substrate 120 and second side 112 of electronic component 110 is distal to first side 121 of substrate 120.

In some examples, substrate 120 can comprise a dielectric structure 123 and a conductive structure 124. Conductive structure 124 can comprise substrate inward terminals **124*a* and substrate outward terminals 124*b*. In some examples, electronic device 100 comprises component interconnects 114, which couple contact pads 113 to inward terminals 124*a*. Component interconnects 114 can also be referred to as connectors or interconnects. In the present example, electronic component 110 is coupled to substrate 120 in a flip-chip configuration or active side down configuration. Underfill 130 can be interposed between electronic component 110 and substrate 120 and can laterally surround component interconnects 114. In some examples, underfill 130 can be along lateral side 115 of electronic component 110. Underfill 130 can be configured to protect component interconnects 114 and to improve the adhesion of electronic component 110 to substrate 120**.

Lid 150 can also be referred to as a first lid or an inner lid, and lid 160 can be referred to as a second lid or an outer lid. Lid 150 and lid 160 together are an example of a lid structure or a cover structure. In some examples, lid 150 can comprise a lid top **150*a* (FIG. 2B) and a lid side wall 150*b* (FIG. 2B) coupled to substrate 120. Lid 150 can comprise an opening 153 in lid top 150*a*, which can be in vertical alignment with second side 112 of electronic component 110 so that at least a portion of second side 112 is exposed through or within opening 153. In some examples, opening 153 and second side 112 of electronic component 110 are in superimposition with respect to each other. Lid 150 further comprises a lid channel 155 extending partially inward from the top side or upper side of lid top 150*a*. Lid channel 155 is configured as a passage for accommodating thermal interface material 140 from opening 153 during a stress event, such as thermal stress, warpage, or other bending of electronic device 100. Lid top 150*a* can also be referred to as or comprise a first top plate or a top plate of lid 150. Lid side wall 150*b*** can also be referred to as or comprise a first lid side wall.

In some examples, lid 160 comprises a lid top 162 and a protrusion 161 that extends inward from lid top 162 towards electronic component 110. In the present example, protrusion 161 comprises a shape and thickness that fits within opening 153 and that leaves space for thermal interface material 140 between lid 160 and electronic component 110. Lid top 162 can also be referred to as or comprises a second top plate or a top plate of lid 160.

In the present example, electronic device 100 comprises a dam structure 151 interposed between lid 150 and second side 112 of electronic component 110. In some examples, dam structure 151 can comprise an attachment material, such as an adhesive, that couples lid top 150*a* to second side 112 of electronic component 110. In some examples, dam structure 151 is configured to contain or control the flow of thermal interface material 140 within electronic device 100 proximate to electronic component 110. In some examples, dam structure 151 can be configured so that thermal interface material 140 is present only along second side 112 of electronic component 110 and does not contact lateral sides of electronic component 110 or underfill 130. In some examples, thermal interface material 140 is within opening 153, covers at least a portion of second side 112 of electronic component 110, and is within lid channel 155. In some examples, a portion of lid channel 155 is devoid of thermal interface material 140.

Electronic device 100 can further comprise an attachment material 152 that couples lid 150 to substrate 120, and an attachment material 154 that couples lid 160 to lid 150. Electronic device 100 further comprises a closing member 170 coupled to lid 150 and lid 160 proximate to lid channel 155. Closing member 170 is configured to seal-off lid channel 155. In some examples, closing member 170 can be coupled to lid 150 and to lid 160 with an attachment material 171.

Substrate 120, underfill 130, thermal interface material 140, lid 150, lid 160, and external interconnects 180 can be referred to as an electronic package or package. The electronic package can protect electronic component 110 from exposure to external elements and/or environments. The electronic package can also provide electrical coupling between electronic component 110 and electronic component(s) 110' or between electronic component 110 and an external component or other electronic packages.

FIGS. 2A, 2B, 2C, 2D, 2E, and 2F show cross-sectional views of an example method for manufacturing an electronic device, such as electronic device 100.

Figures 2A, 2B:
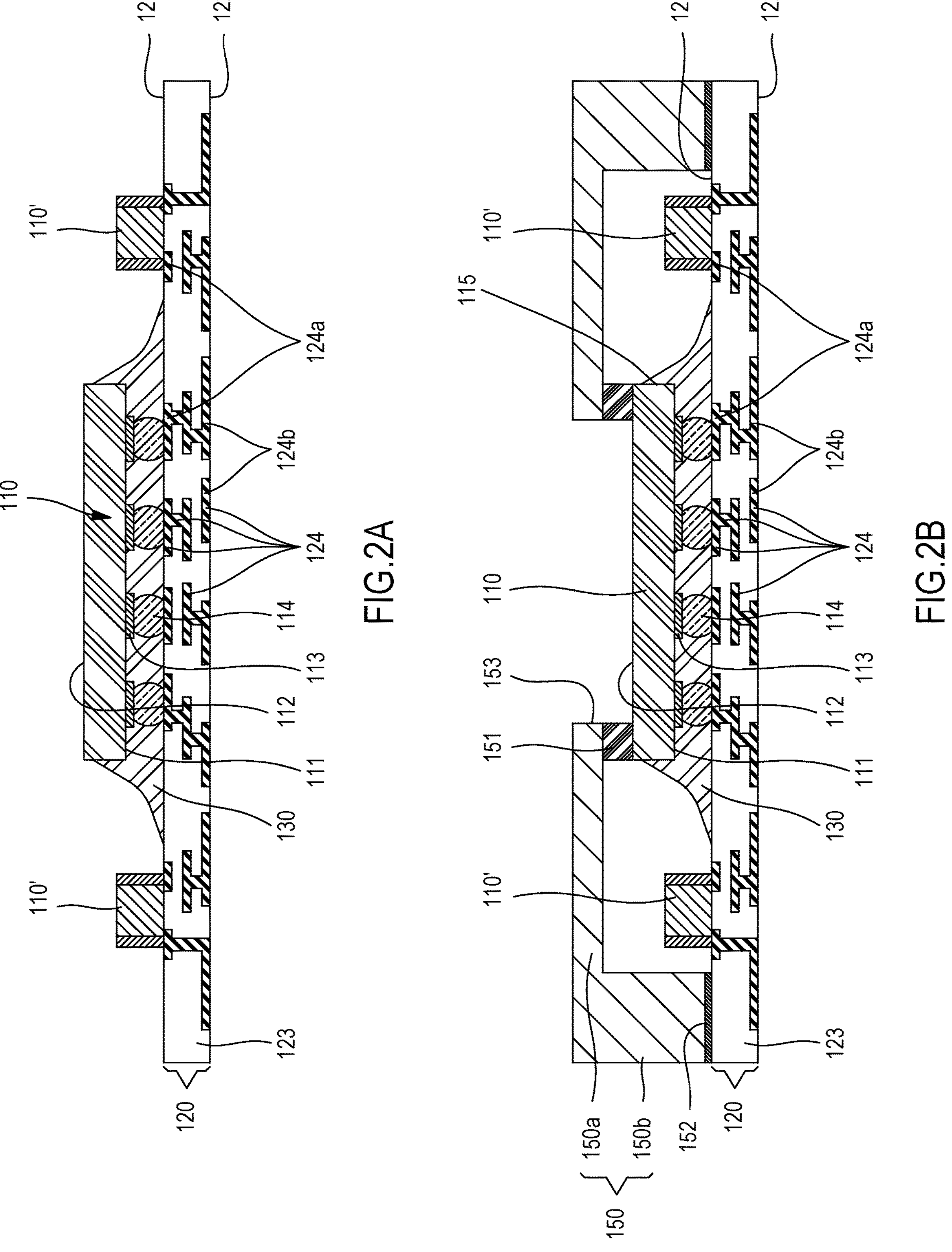
FIGS. 2A, 2B, 2C, 2D, 2DA, 2E, and 2F show cross-sectional views of an example method for manufacturing an example electronic device.

FIG. 2A shows a cross-sectional view of electronic device 100 at an early stage of manufacture. In the example shown in FIG. 2A, substrate 120 can be provided, and electronic component 110 can be provided on first side 121 of substrate 120. In some examples, electronic component(s) 110' can be provided on first side of substrate 120. In some examples, electronic components 110' are laterally spaced apart from electronic component 110. In some examples, underfill 130 can be provided between first side 111 of electronic component 110 and first side 121 of substrate 120.

In some examples, substrate 120 can comprise or be referred to as a laminate substrate, a redistribution layer (RDL) substrate, a buildup substrate, a coreless substrate, a rigid substrate, a glass substrate, a semiconductor substrate, a printed circuit board, a multi-layer substrate, a molded lead frame, or a ceramic substrate. Substrate 120 can comprise dielectric structure 123 and conductive structure 124. In some examples, substrate 120 can have an area varying according to the area or number of electronic components 110 and 110'. In some examples, substrate 120 can have an area of about 8 mm (millimeter)×8 mm to about 150 mm×150 mm. In some examples, substrate 120 can have a thickness of about 0.2 mm to about 4 mm.

In some examples, conductive structure 124 can comprise or be referred to as one or more conductors, conductive materials, conductive paths, conductive layers, RDLs, wiring layers, traces, vias, pads, or under bump metallization (UBM). In some examples, one or more of the conductive layers can be interleaved with dielectric layers of dielectric structure 123. In some examples, conductive structure 124 can comprise copper, aluminum, palladium, titanium, tungsten, titanium/tungsten, nickel, gold, or silver. In some examples, conductive structure 124 can be provided by sputtering, electroless plating, electrolytic plating, physical vapor deposition (PVD), chemical vapor deposition (CVD), metal organic chemical vapor deposition (MOCVD), atomic layer deposition (ALD), low pressure chemical vapor deposition (LPCVD), plasma enhanced chemical vapor deposition (PECVD), or other processes as known to one of ordinary skill in the art. In some examples, portions of conductive structure 124 can be exposed from first side 121 of substrate 120 and from second side 122 of substrate 120.

Conductive structure 124 can include substrate inward terminals, inner contact pads, traces, or lands 124*a* and substrate outward terminals, outer contact pads, traces, or lands 124*b*. Substrate inward terminals 124*a* can be exposed from first side 121 of substrate 120 and substrate outward terminals 124*b* can be exposed from second side 122 of substrate 120. In some examples, substrate inward terminals 124*a* or substrate outward terminals 124*b* can be provided in a matrix form having rows or columns, respectively. Conductive structure 124 can be coupled to electronic components 110 and 110' and external interconnects 180 (FIG. 1A). For example, electronic components 110 and 110' can be coupled to substrate inward terminals 124*a* and external interconnects 180 can be coupled to substrate outward terminals 124*b*. Conductive structure 124 can transmit signals, currents, or voltages within substrate 120. In some examples, the thickness of conductive structure 124 can range from about 3 μm to about 100 μm. The thickness of conductive structure 124 can refer to individual layers of conductive structure 124.

In some examples, dielectric structure 123 can comprise or be referred to as one or more dielectrics, dielectric materials, dielectric layers, passivation layers, insulating layers, or protective layers. In some examples, dielectric structure 123 can have a structure where one or more dielectric layers are stacked. In some examples, dielectric structure 123 can comprise a polymer, polyimide (PI), benzocyclobutene (BCB), polybenzoxazole (PBO), bismaleimide triazine (BT), a molding material, phenolic resin, epoxy, silicone, or acrylate polymer. Dielectric structure 123 can be in contact with conductive structure 124. Dielectric structure 123 can expose portions of conductive structure 124. In some examples, dielectric structure 123 can maintain the external shape of substrate 120 and can structurally support conductive structure 124 and electronic components 110 and 110'. In some examples, dielectric structure 123 can be provided by spin coating, spray coating, printing, oxidation, PVD, CVD, MOCVD, ALD, LPCVD, PECVD, or other processes as known to one of ordinary skill in the art. The upper and lower sides of dielectric structure 123 can be part of first side 121 of substrate 120 and second side 122 of substrate 120, respectively. In some examples, the thicknesses of individual layers of dielectric structure 123 can range from about 3 μm to about 100 μm. The combined thickness of all layers of dielectric structure 123 can define the thickness of substrate 120. In some examples, the total thickness of dielectric structure 123 can range from about 10 μm (micrometers) to 500 μm.

In some examples, substrate 120 can be an RDL substrate. RDL substrates can comprise one or more conductive redistribution layers and one or more dielectric layers and (a) can be formed layer by layer over an electronic device to where the RDL substrate is to be coupled, or (b) can be formed layer by layer over a temporary carrier that can be entirely removed or at least partially removed after the electronic device and the RDL substrate are coupled together. RDL substrates can be manufactured layer by layer as a wafer-level substrate on a round wafer in a wafer-level process, and/or as a panel-level substrate on a rectangular or square panel carrier in a panel-level process. RDL substrates can be formed in an additive buildup process and can include one or more dielectric layers alternatingly stacked with one or more conductive layers and define respective conductive redistribution patterns or traces configured to collectively (a) fan-out electrical traces outside the footprint of the electronic device, and/or (b) fan-in electrical traces within the footprint of the electronic device. The conductive patterns can be formed using a plating process such as, for example, an electroplating process or an electroless plating process. The conductive patterns can comprise a conductive material such as, for example, copper or other plateable metal. The locations of the conductive patterns can be made using a photo-patterning process such as, for example, a photolithography process and a photoresist material to form a photolithographic mask. The dielectric layers of the RDL substrate can be patterned with a photo-patterning process and can include a photolithographic mask through where light is exposed to photo-pattern desired features such as vias in the dielectric layers. The dielectric layers can be made from photo-definable organic dielectric materials such as, for example, polyimide (PI), benzocyclobutene (BCB), or polybenzoxazole (PBO). Such dielectric materials can be spun-on or otherwise coated in liquid form, rather than attached as a pre-formed film. To permit proper formation of desired photo-defined features, such photo-definable dielectric materials can omit structural reinforcers or can be filler-free, without strands, weaves, or other particles, and could interfere with the light from the photo-patterning process. In some examples, such filler-free characteristics of filler-free dielectric materials can permit a reduction of the thickness of the resulting dielectric layer. Although the photo-definable dielectric materials described above can be organic materials, in some examples the dielectric materials of the RDL substrates can comprise one or more inorganic dielectric layers. Some examples of inorganic dielectric layer(s) can comprise silicon nitride ($Si_3N_4$), silicon oxide ($SiO_2$), or silicon oxynitride (SiON). The inorganic dielectric layer(s) can be formed by growing the inorganic dielectric layers using an oxidation or nitridization process instead using photo-defined organic dielectric materials. Such inorganic dielectric layers can be filler-free, without strands, weaves, or other dissimilar inorganic particles. In some examples, the RDL substrates can omit a permanent core structure or carrier such as, for example, a dielectric material comprising bismaleimide triazine (BT) or FR4 and these types of RDL substrates can comprise or be referred to as a coreless substrate.

In some examples, substrate 120 can be a pre-formed substrate. Pre-formed substrates can be manufactured prior to attachment to an electronic device and can comprise dielectric layers between respective conductive layers. The conductive layers can comprise copper and can be formed using an electroplating process. The dielectric layers can be relatively thicker non-photo-definable layers and can be attached as a pre-formed film rather than as a liquid and can include a resin with fillers such as strands, weaves, and/or other inorganic particles for rigidity and/or structural support. Since the dielectric layers are non-photo-definable, features such as vias or openings can be formed by using a drill or laser. In some examples, the dielectric layers can comprise a prepreg material or Ajinomoto Buildup Film (ABF). The pre-formed substrate can include a permanent core structure or carrier such as, for example, a dielectric material comprising bismaleimide triazine (BT) or FR4, and dielectric and conductive layers can be formed on the permanent core structure. In other examples, the pre-formed substrate can be a coreless substrate and omits the permanent core structure, and the dielectric and conductive layers can be formed on a sacrificial carrier and is removed after formation of the dielectric and conductive layers and before attachment to the electronic device. The pre-formed substrate can be referred to as a printed circuit board (PCB) or a laminate substrate. Such pre-formed substrate can be formed through a semi-additive or modified-semi-additive process.

Electronic component 110 can be provided on first side 121 of substrate 120. In some examples, electronic component 110 can be located at the center of first side 121 of substrate 120. In some examples, electronic component 110 can comprise or be referred to as one or more dies, chips, or packages. In some examples, electronic component 110 can comprise a memory, a digital signal processor (DSP), a microprocessor, a network processor, a power management processor, an audio processor, an RF circuit, a wireless baseband system-on-chip (SoC) processor, a power semiconductor device, a sensor, or an application specific integrated circuit (ASIC).

Electronic component 110 can comprise contact pads 113. Contact pads 113 of electronic component 110 can be provided on the first side 111 of electronic component 110. Contact pads 113 of electronic component 110 can be input/output terminals of electronic component 110. Contact pads 113 of electronic component 110 can be provided to be spaced apart from each other in a row or column direction on first side 111 of electronic component 110. In some examples, contact pads 113 of electronic component 110 can be bond pads of the electronic component 110, or RDL pads exposed through a dielectric material provided as part of electronic component 110. In some examples, the dielectric material can comprise SiN or $SiO_2$.

Electronic component 110 can be coupled to substrate 120 with component interconnects 114 in contact with or electrically connected to contact pads 113 of electronic component 110 and inward terminals **124*a* of conductive structure 124. In some examples, component interconnects 114 can comprise or be referred to as bumps, SnPb bumps, leadfree bumps, CuP, stud bumps, pillars, posts, solder capped pillars, or solder coated copper core balls. In some examples, component interconnects 114 can be provided over contact pads 113 of electronic component 110. In some examples, component interconnects 114 can comprise copper (Cu), lead (Pb), tin (Sn), aluminum (Al), palladium (Pd), titanium (Ti), tungsten (W), titanium/tungsten (Ti/W), nickel (Ni), gold (Au), or silver (Ag) In some examples, component interconnects 114** can have a thickness (height) of approximately 10 μm to approximately 300 μm and a pitch of approximately 10 μm to approximately 300 μm.

In some examples, pick-and-place equipment can pick up electronic component 110 and place electronic component 110 on substrate first side 121 of substrate 120. Component interconnects 114 can be positioned on substrate inward terminals **124*a* of substrate 120. Subsequently, component interconnects 114 of electronic component 110 can be in contact with and be bonded to substrate inward terminals 124*a* of substrate 120 through a mass reflow process, a thermal compression process, or a laser bonding process. In some examples, the overall thickness of electronic component 110 can range from about 0.3 mm to about 9 mm, and the area of electronic component 110 can range from about 1.0 mm×1.0 mm to about 70 mm×70 mm. In some examples, electronic component 110 or other electronic components can be provided on second side 122 of substrate 120**.

Underfill 130 can be provided between electronic component 110 and substrate 120. In some examples, underfill 130 can comprise or be referred to as capillary underfill (CUF), molded underfill (MUF), non-conductive paste (NCP), non-conductive film (NCF), or anisotropic conductive film (ACF). In some examples, underfill 130 can comprise epoxy, a thermoplastic material, a thermosetting material, polyimide, polyurethane, a polymeric material, filled epoxy, a filled thermoplastic material, a filled thermosetting material, filled polyimide, filled polyurethane, a filled polymeric material, or a fluxing underfill. In some examples, underfill 130 is interposed between first side 111 of electronic component 110 and first side 121 of substrate 120. In some examples, underfill 130 can cover or surround component interconnects 114. Underfill 130 contacts first side 121 of substrate 120 and first side 111 of electronic component 110. In some examples, underfill 130 can cover, at least, a lower portion of lateral side 115 of electronic component 110. In some examples, underfill 130 can prevent or reduce occurrences of electronic component 110 being separated from substrate 120. In some examples, the thickness of underfill 130 can range from about 80 μm to about 800 μm.

In some examples, underfill 130 can be cured after being interposed between electronic component 110 and substrate 120. Underfill 130 can prevent electronic component 110 from being separated from substrate 120 against physical and chemical impact.

In some examples, electronic component 110 can comprise a metallization layer in contact with second side 112 of electronic component 110. In some examples, the metallization layer can comprise or be referred to as a backside metallization (BSM) plating layer, a conductive film, or a conductive layer.

In some examples, electronic component(s) 110' can comprise or be referred to as a passive component, an antenna patch, or an integrated passive device (IPD). In some examples, electronic component 110' can be located outside the electronic component 110 on a plane. For example, electronic component 110' can be in contact with and be electrically connected to substrate inward terminals **124*a* of first side 121 of substrate 120. In some examples, one or more electronic components 110' can be provided on second side 112 of substrate 120. For example, electronic component 110' can be in contact with and be electrically connected to substrate outward terminals 124*b***.

Figure 3B:
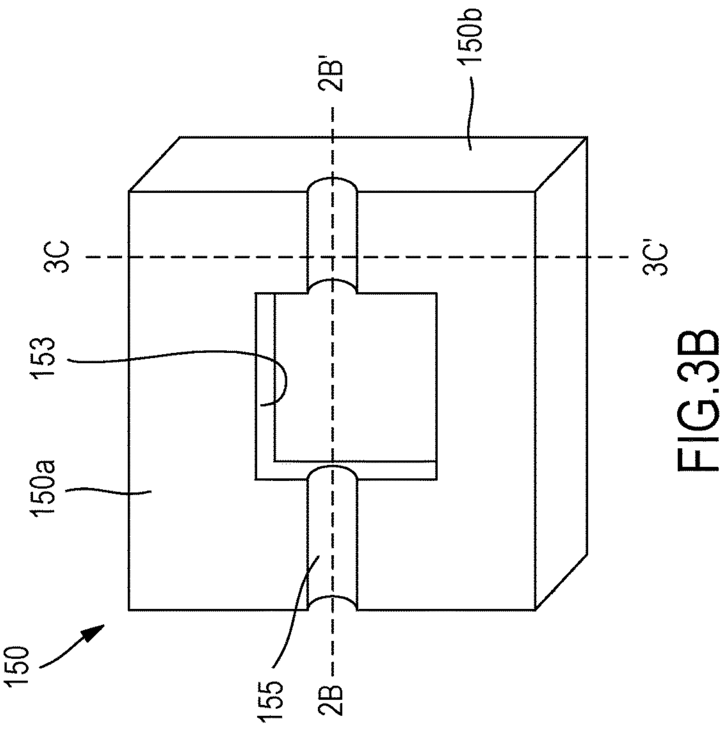
FIGS. 3A and 3B show a bottom plan view and a top plan view respectively of an example first lid of an electronic device.
Figure 3A:
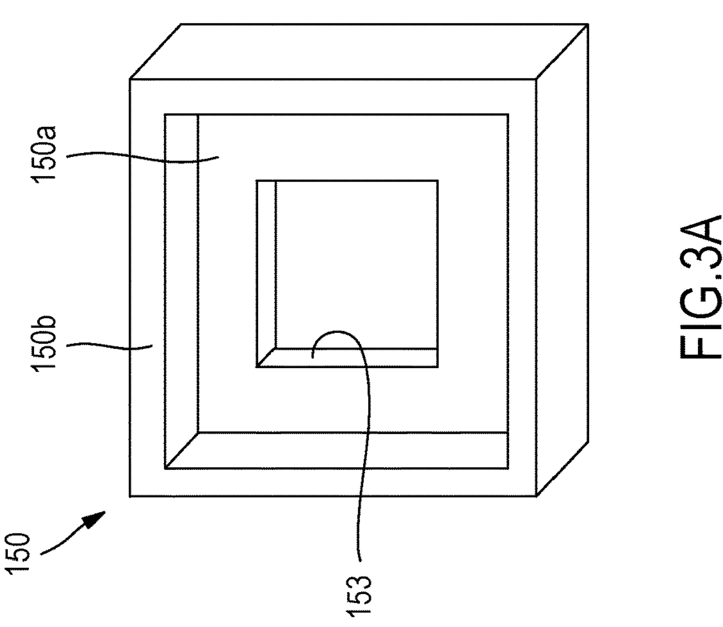
Figure 3B:
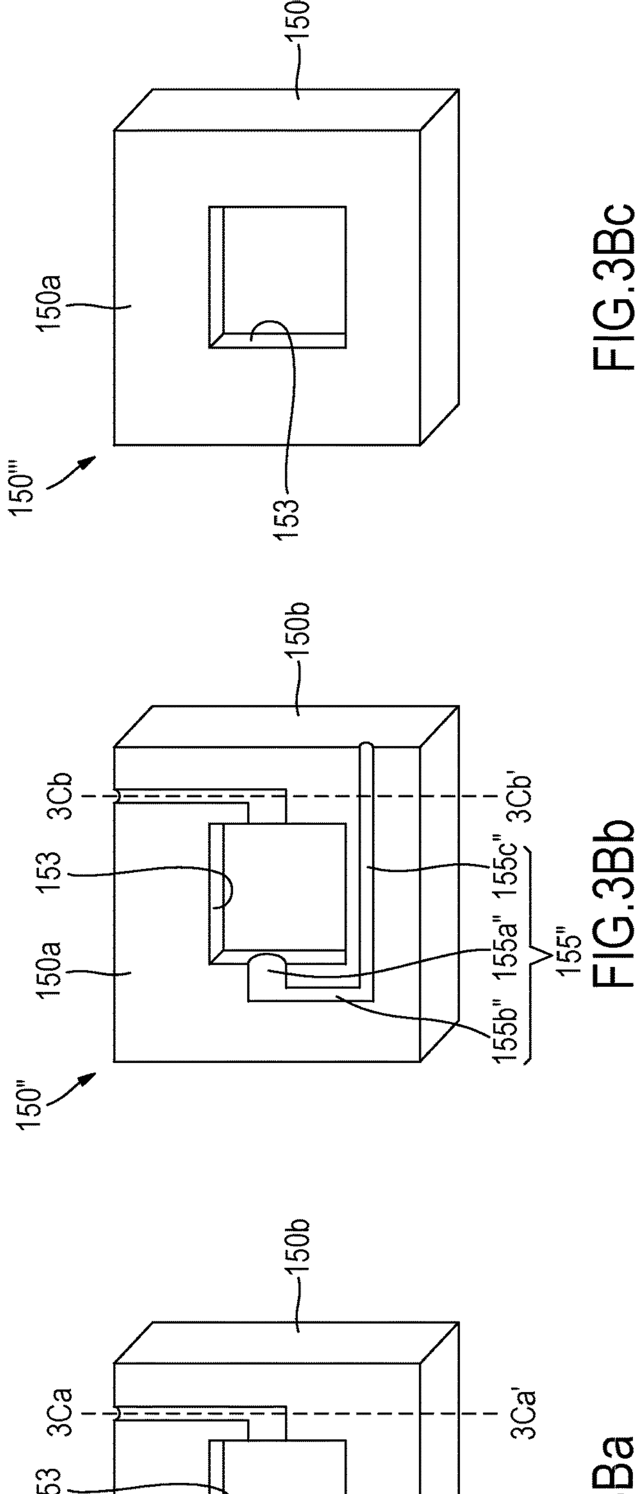
Figure 3C:
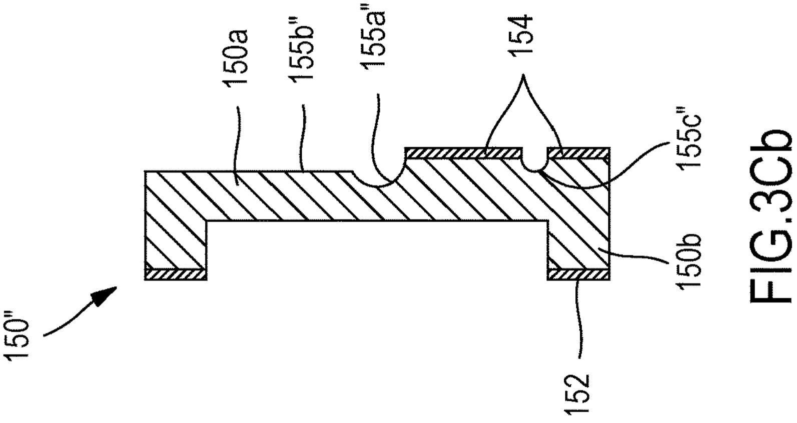
FIG. 3C shows a cross-sectional view taken along reference line 3C-3C' of FIG. 3B.
Figure 3C:
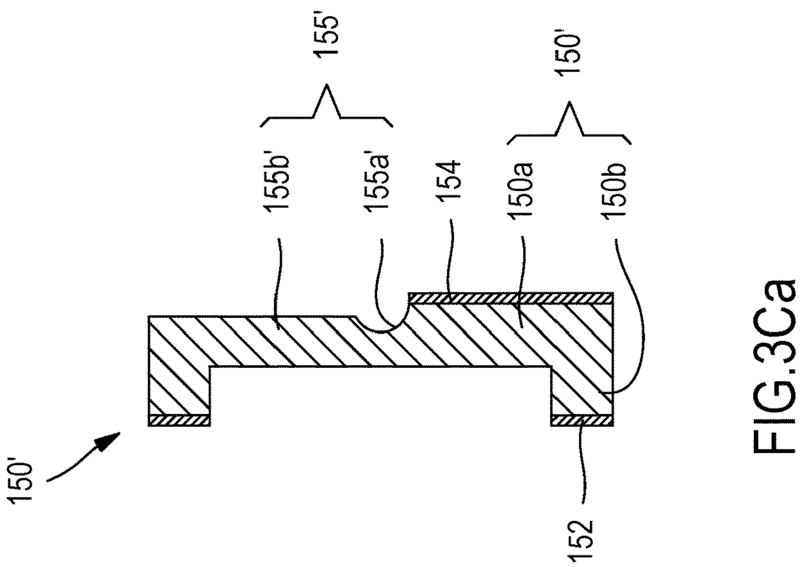
Figure 3C:
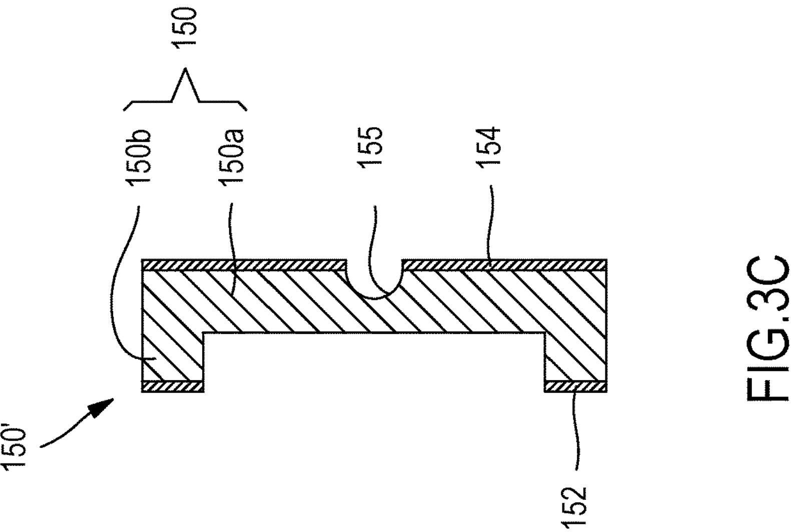

FIG. 2B shows electronic device 100 at a later stage of manufacture. In the example shown in FIG. 2B, lid 150 can be provided over and couped to first side 121 of substrate 120 and second side 112 of electronic component 110. FIG. 3A is a bottom plan view of lid 150, FIG. 3B is a top plan view of lid 150, and FIG. 3C is a cross-sectional view taken along line 3C-3C' in FIG. 3B. FIG. 2B is a cross-sectional view of electronic device 100 taken along line 2B-2B' in FIG. 3B.

In some examples, lid 150 comprises lid top **150*a* and lid side wall 150*b* extending downward from edges of lid top 150*a*. In some examples, lid top 150*a* can comprise a rectangular shaped plate and lid side wall 150*b* can extend downward from four edges of lid top 150*a*. In some examples, lid side wall 150*b* can comprise a square or rectangular ring shape. In some examples, lid side wall 150*b* and lid top 150*a* define a cavity and electronic component 110 can be located within the cavity. In some examples, lid 150 can cover electronic component 110. The lower side of lid top 150*a* can be adhered and fixed to second side 112 of electronic component 110 through dam structure 151. The lower side of lid side wall 150*b* can be adhered and fixed to first side 121 of substrate 120 with attachment material 152. In some examples, the thickness of lid top 150*a* can range from approximately 0.5 mm to approximately 3 mm. In some examples, the thickness (height) of lid side wall 150*b* can range from approximately 0.7 mm to approximately 8 mm and the width of lid side wall 150*b* can range from approximately 1 mm to approximately 30 mm. Lid 150 can be made of a thermally conductive material having high heat conduction and radiation. In some examples, lid 150 can comprise one or more metals, such as aluminum, copper, or similar materials known to one of ordinary skill in the art. In some examples, lid 150** can comprise or be referred to as a heatsink, a dissipation plate, a cap cover, an encapsulation part, a protection part, a package, or a body.

Lid 150 can comprise opening 153 extending through the center of lid top **150*a* and in general alignment with electronic component 110. Opening 153 can expose second side 112 of electronic component 110. Opening 153 can have a rectangular shape on a plane or other shapes, such as circular or rounded shapes. Opening 153** can comprise an area in a range from about 0.5 mm×0.5 mm to about 70 mm×70 mm.

With particular reference to FIG. 3B, lid 150 can comprise lid channel 155 provided in a downward direction from the top side of lid top **150*a*. As shown in FIG. 3B, in some examples, lid channel 155 can have a rounded or partially rounded shape in cross-sectional view (e.g., a rounded, curved channel floor). In some examples, lid channel 155 can have a rectangular shape in cross-section view (e.g., a flat, planar channel floor). In some examples, lid channel 155 can have a “V” shape in cross-sectional view (e.g., two sidewalls that meet at a point or apex). In some examples, lid channel 155 can be referred to as a slit or groove. Lid channel 155 can extend from one side of opening 153 to one edge of lid top 150*a*. In some examples, lid channel 155 can be configured to provide a straight path or channel extending from the side of opening 153 to the edge of lid top 150*a* (e.g., lid channel 155 can be parallel to two sides of lid top 150*a* on a plane). In some examples, lid channel 155 can be provided on both sides of opening 153 to be symmetrical to the upper side of lid top 150*a* (e.g., a first portion of lid channel 155 can extend from opening 153 to a first edge of lid top 150*a* and a second portion of lid channel 155 can extend from opening 153 to a second, opposing edge of lid top 150*a*). A depth of lid channel 155 can be smaller than thicknesses of other regions of lid top 150*a*. In some examples, the depth of lid channel 155 can range from approximately 50 μm to approximately 1000 μm, and the width of lid channel 155 can range from approximately 50 μm to approximately 1000 μm. Lid 150 is an example of first lid comprising lid channels (for example, a pair of lid channels) that are coupled to opening 153 and that extend from opening 153** to opposing lateral sides of the first lid.

Returning to FIG. 2B, in some examples, dam structure 151 couples the lower side of lid top **150*a* of lid 150 to electronic component 110, and the lower side of lid side wall 150*b* can be adhered to substrate 120 through attachment material 152. Before the lid 150 is provided and coupled to substrate 120 and electronic component 110, dam structure 151 and attachment material 152 can be provided on electronic component 110 and substrate 120, respectively. In some examples, dam structure 151** can comprise an adhesive material and can be provided along an edge of second side

112 of electronic component 110. In some examples, dam structure 151 can be provided in a square or rectangular ring shape along each edge of second side 112 of electronic component 110. In some examples, an outer edge of dam structure 151 can be coplanar with lateral side 115 of electronic component 110. In some examples, an inner edge of dam structure 151 can be coplanar with an edge of opening 153 of lid 150. In some examples, attachment material 152 can be provided along an edge of first side 121 of substrate 120. Dam structure 151 and attachment material 152 can also comprise or be referred to as a bonding material, an adhesive, or an interface material.

In some examples, dam structure 151 or attachment material 152 can comprise a thermally curable adhesive, a photo-curable adhesive, or a non-curable adhesive (e.g., a rubber-based adhesive, an acryl-based adhesive, a vinyl alkyl ether-based adhesive, a silicone-based adhesive, a polyester-based adhesive, a polyamide-based adhesive, or a urethane-based adhesive). In some examples, dam structure 151 and attachment material 152 can comprise a dielectric. In some examples, dam structure 151 or attachment material 152 can comprise an electrically conductive material. Dam structure 151 can be provided on second side 112 of electronic component 110 and attachment material 152 can be provided to first side 121 of substrate 120 by dispensing. In some examples, dam structure 151 and attachment material 152 can comprise similar material(s). In some examples, dam structure 151 and attachment material 152 can comprise different materials. In other examples, the material for dam structure 151 can be provided to the lower side of lid top 150*a* or attachment material 152 can be provided on the lower side of lid side wall 150*b* first, and then lid 150 can be attached to electronic component 110 and substrate 120.

In some examples, the height of dam structure 151 can be greater than attachment material 152. In some examples, the height of dam structure 151 can range from approximately 20 μm to approximately 500 μm. In some examples, the height of attachment material 152 can range from approximately 10 μm to approximately 200 μm.

Figure 2C:
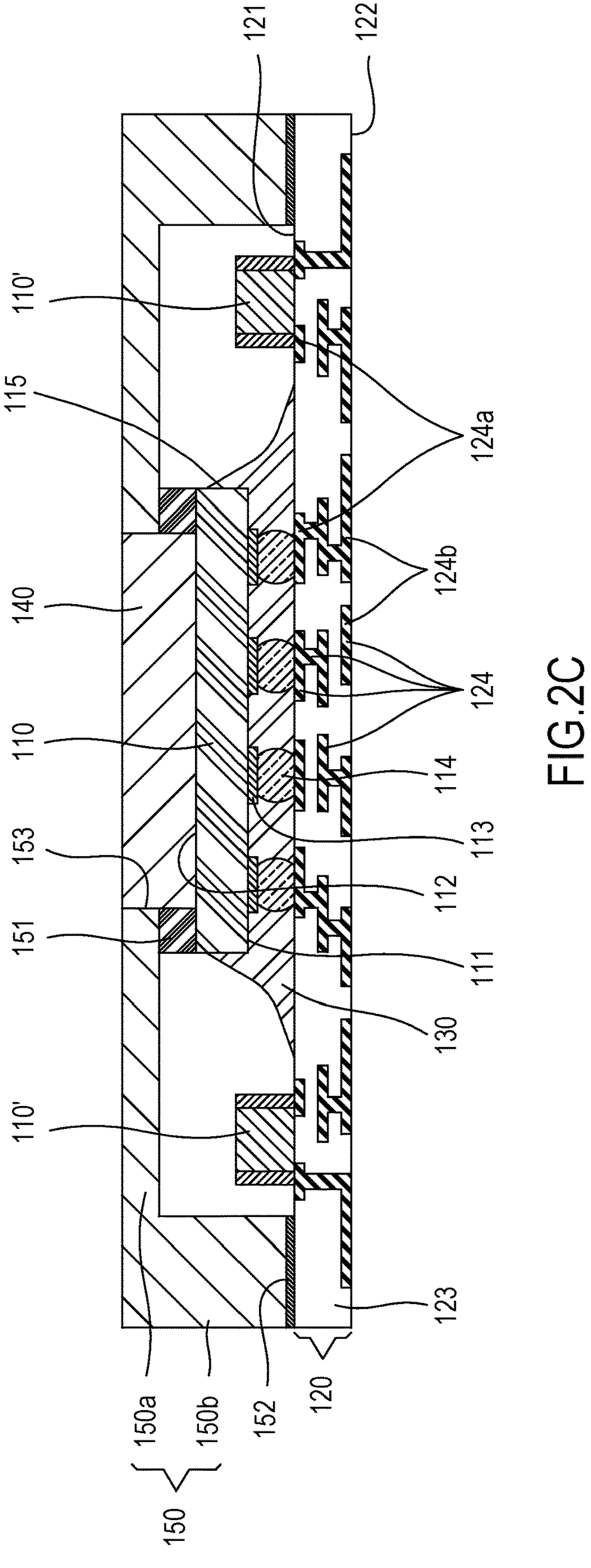
Figure 2D:
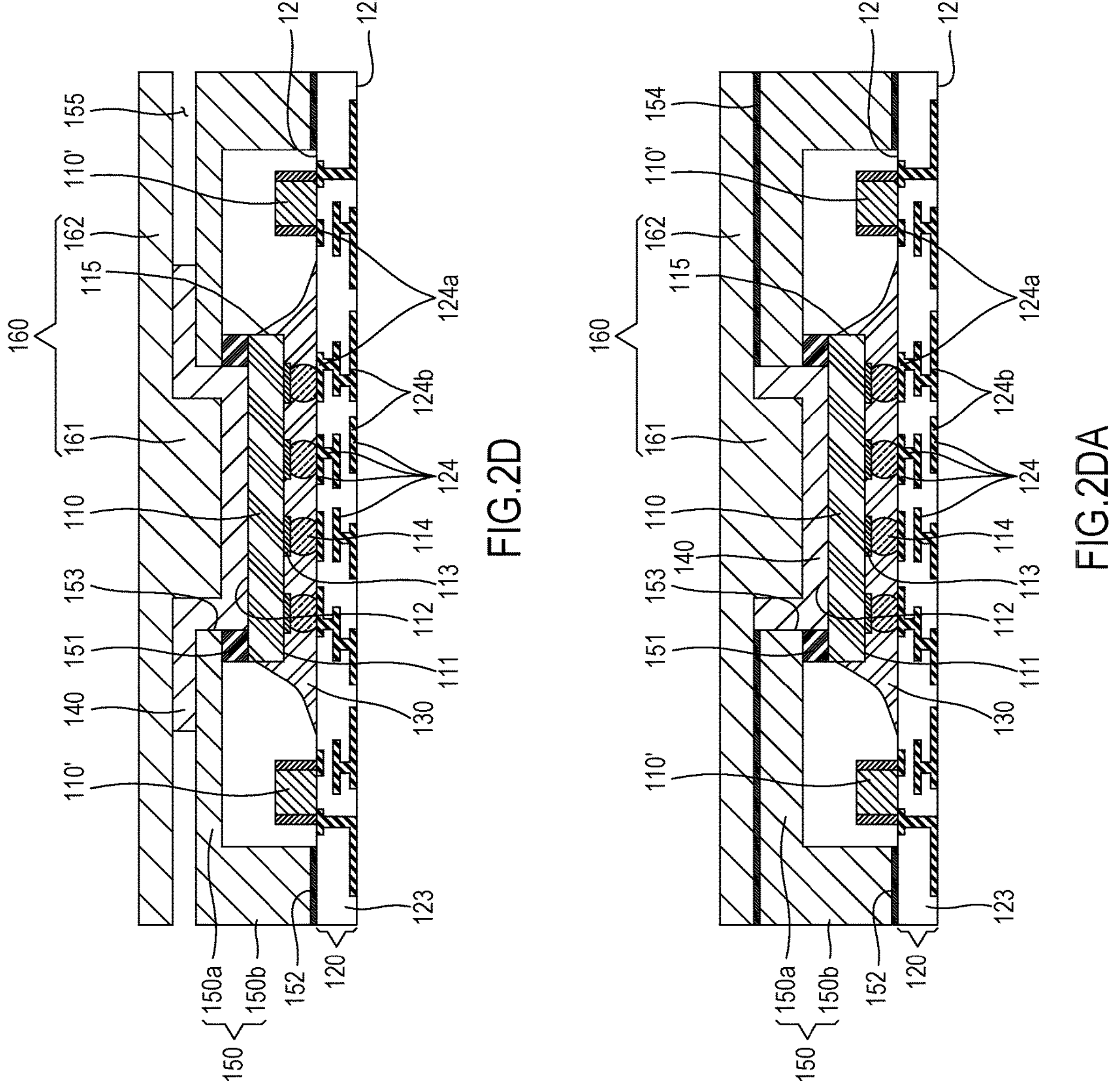

With momentary reference to FIGS. 3C and 2DA, in some examples, attachment material 154 can be provided on the upper side of lid top 150*a* of lid 150. In some examples, attachment material 154 can be provided after lid 150 is coupled to substrate 120 and electronic component 110. Attachment material 154 be provided on a region other than lid channel 155 of lid top 150*a* of lid 150. Attachment material 154 can have elements, features, materials, or manufacturing methods similar to or the same as those of attachment material 152. Attachment material 154 can also comprise or be referred to as a bonding material, an adhesive, or an interface material.

FIG. 3Ba is a top plan view of another example of a lid 150', and FIG. 3Ca is a cross-sectional view taken along line 3Ca-3Ca' in FIG. 3Ba. Lid 150' can have similarities to lid 150 shown in FIGS. 3A, 3B, and 3C in terms of, for example, lid top 150*a*, lid side wall 150*b*, dam structure 151, attachment material 152, opening 153, and attachment material 154. In lid 150', opening 153 can be provided proximate to a center or central portion of lid top 150*a*. In some examples, lid 150' can be coupled to electronic component 110 and substrate 120 through dam structure 151 and attachment material 152. Attachment material 154 can be provided to the upper side of lid top 150*a* of lid 150', except where lid channel 155' is provided.

In lid 150', lid channel 155' can comprise lid channel portion 155*a'* and lid channel portion 155*b'*. Lid channel portion 155*a'* can also be referred to as or comprise a first lid channel and lid channel portion 155*b'* can also be referred to as or comprise a second lid channel. Lid channel portion 155*a'* can extend from one side of opening 153 toward a first lateral side of lid top 150*a*. Lid channel portion 155*a'* can have one end located in opening 153 and the other end connected to lid channel portion 155*b'*. Lid channel portion 155*b'* can extend from the end of lid channel portion 155*a'* to a second lateral side of the lid top 150*a* (e.g., the second lateral side can be perpendicular to or can abut the first lateral side). In some examples, lid channel portion 155*b'* can be generally perpendicular to the lid channel portion 155*a'*. In some examples, the width of lid channel portion 155*b'* can be smaller than lid channel portion 155*a'* In some examples, the depth of lid channel portion 155*b'* can be equal to or smaller than lid channel portion 155*a'*. Lid channel portion 155*a'* can be parallel to a first pair of opposing lateral sides of lid top 150*a* and lid channel portion 155*b'* can be parallel to a second pair of opposing lateral sides of lid top 150*a*. The depth and width of lid channel portion 155*a'* can be similar to the depth and width of lid channel 155 of lid 150 in FIG. 3B. The depth of lid channel portion 155*b'* can range from approximately 10 μm to approximately 500 μm, and the width of lid channel portion 155*b'* can range from approximately 10 μm to approximately 500 μm. Lid 150' is an example of a first lid comprising lid channels (for example, a pair of lid channels) that are coupled to opening 153 and that extend from opening 153 to opposing lateral sides of the first lid.

FIG. 3Bb is a top plan view of another example of a lid 150", and FIG. 3Cb is a cross-sectional view taken along line 3Cb-3Cb' in FIG. 3Bb. Lid 150" can have similarities to lid 150 shown in FIGS. 3A, 3B, and 3C in terms of, for example, lid top 150*a*, lid side wall 150*b*, dam structure 151, attachment material 152, opening 153, and attachment material 154. Lid 150" can comprise lid top 150*a* and lid side wall 150*b*. In lid 150", opening 153 can be provided proximate to a center or central portion of lid top 150*a*. In some examples, lid 150" can be coupled to electronic component 110 and substrate 120 through dam structure 151 and attachment material 152. Attachment material 154 can be provided on the upper side of lid top 150*a* of lid 150" except where lid channel 155" is provided.

In lid 150", lid channel 155" can comprise lid channel portion 155*a"*, lid channel portion 155*b"*, and lid channel portion 155*c"*. Lid channel portion 155*a"* can be referred to as or comprise a first lid channel, lid channel portion 155*b"* can be referred to as or comprises a second lid channel, and lid channel portion 155*c"* can also be referred to as or comprise a third lid channel. In some examples, lid channel portion 155*a"* and lid channel portion 155*b"* can be similar to lid channel portion 155*a'* and lid channel portion 155*b'* of lid 150' shown in FIGS. 3Ba and 3Ca. However, in the present example, lid channel portion 155*a"* can extend from one side of opening 153 toward a first lateral side of lid top 150*a*, lid channel portion 155*b"* can extend from the end of lid channel portion 155*a"* partially towards a second lateral side of lid top 150*a*, and lid channel portion 155*b"* can have an opposite end connected to lid channel portion 155*c"*. Lid channel portion 155*c"* can extend towards a third lateral side of lid top 150*a* that is different than the first lateral side or the second lateral side (e.g., the third lateral side can be opposite the first lateral side and perpendicular to the second lateral side). Lid channel portion 155*c"* can be parallel to lid channel portion 155*a"* and can be perpendicular to lid channel portion 155*b"*. Lid channel portion 155*b"* can be perpendicular to lid channel portion 155*a"* and to lid channel portion 155*c"*.

In some examples, the width of lid channel portion 155*b*" can be similar to the width of lid channel portion 155*c*". In some examples, the width of lid channel portion 155*b*" and the width of lid channel portion 155*c*" can be smaller than the width of lid channel portion 155*a*". In some examples, the depth of lid channel portion 155*b*" and the depth of lid channel portion 155*c*" can be equal to or smaller than the depth of lid channel portion 155*a*". Lid channel portion 155*a*" and lid channel portion 155*c*" can be parallel to a first pair of opposing lateral sides of lid top 150*a*. Lid channel portion 155*b*" can be parallel to a second pair of opposing laterals sides connecting the first pair of opposing lateral sides. In some examples, the depth and width of lid channel portion 155*a*" can be similar to the depth and width of lid channel 155 of lid 150 in FIGS. 3B and 3C. In some examples, the depth and width of lid channel portion 155*b*" and lid channel portion 155*c*" can be similar to the depth and width of lid channel portion 155*b*' in FIGS. 3Ba and 3Ca. Lid 150" is an example of first lid comprising lid channels or lid channel portions (for example, a pair of lid channels) that are coupled to opening 153 and that extend to adjoining or adjacent lateral sides of the first lid.

FIG. 2C shows electronic device 100 at a later stage of manufacture. In the example shown in FIG. 2C, thermal interface material (TIM) 140 can be provided within opening 153 of lid 150. Thermal interface material 140 can be in contact with second side 112 of electronic component 110. Thermal interface material 140 can be in contact with dam structure 151 and the edges of lid 150 that define opening 153. In examples where electronic component 110 comprises a metallization layer adjacent to second side 112, contact and bonding force between thermal interface material 140 and second side 112 of electronic component 110 can be improved.

In some examples, thermal interface material 140 can be provided to fill the space or volume defined by dam structure 151, opening 153, and second side 112 of electronic component 110. In some examples, thermal interface material 140 can be in liquid form and can be provided using a dispensing process. In some examples, thermal interface material 140 can be in contact with edges of lid 150 in opening 153 and dam structure 151. Dam structure 151 can prevent thermal interface material 140 from flowing to areas other than second side 112 of electronic component 110.

In some examples, when thermal interface material 140 is provided, the upper side of thermal interface material 140 can be coplanar with the upper side of lid top 150*a*. In some examples, thermal interface material 140 can comprise a metallic TIM or a polymer TIM. In some examples, thermal interface material 140 can be a gallium alloy. For example, thermal interface material 140 can be in liquid form with gallium used as a base and indium, tin, or zinc added. Since thermal interface material 140 comprises a thermally conductive material having a metallic component, heat generated from electronic component 110 can be easily transferred to lid 160 (FIG. 2D).

FIGS. 2D and 2DA show electronic device 100 at a later stage of manufacture. FIG. 2D is a cross-sectional view taken along line A-A' with respect to electronic device 100 of FIG. 1C, and FIG. 2DA is a cross-sectional view taken along line B-B' with respect to electronic device 100 of FIG. 1C. In the example shown in FIGS. 2D and 2DA, lid 160 can be provided and coupled to thermal interface material 140 and lid 150. FIG. 4A is a bottom plan view of an example lid 160.

Lid 160 can comprise lid top 162 and protrusion 161 of lid 160 protruding downward from the center of lid top 162. In some examples, lid top 162 can comprise a rectangular generally flat plate structure. In some examples, protrusion 161 can have a shape that is similar to the shape of opening 153 of lid 150. In some examples, protrusion 161 comprises a quadrangular shape. In some examples, protrusion 161 can have a hexahedral column shape. Protrusion 161 comprises a size that is smaller than opening 153 and that leaves a gap or space between edges of lid top 150*a* that define opening 153 and protrusion 161 and between electronic component 110 and the bottom side of protrusion 161 to accommodate thermal interface material 140. In some examples, a lower side of lid top 162 can be coupled to the upper side of lid top 150*a* of lid 150 with attachment material 154. Lid channel 155 can be positioned between the lower side of lid top 162 and the upper side of lid top 150*a*. In some examples, lateral sides of lid 150 and lateral sides of lid 160 can be substantially coplanar.

Protrusion 161 of lid 160 can be positioned within opening 153. In some examples, protrusion 161 of lid 160 can press a top portion of thermal interface material 140. During or because of coupling lid 160 to lid 150, thermal interface material 140 located in opening 153 of lid 150 can be displaced and can move into lid channel 155. In addition, any trapped gases can be removed to the outside through lid channel 155. Among other things, this improves the planarity of lid 150 and lid 160 with respect to each other and improves the bond strength between lid 150 and lid 160. In this way, lid channel 155 can be a path through where thermal interface material 140 can move when warpage, distortion, or shape deformation occurs due to, for example, a difference in thermal expansion coefficient between substrate 120, electronic component 110, lid 150, or lid 160. Similarly, lid channel 155 can serve as a buffer against an expansion or flow of thermal interface material 140 caused by, for example, the size or volume change of the spaced defined by electronic component 110, dam structure 151, lid side wall 150*b*, and the bottom side of lid 160 due to thermal expansion or the volume change of thermal interface material 140 due to thermal expansion. Thermal interface material 140 can be interposed between the lower side of protrusion 161 of lid 160 and second side 112 of electronic component 110. Thermal interface material 140 can transfer heat generated from electronic component 110 to lid 160 including through protrusion 161.

In some examples, the thickness of lid top 162 can range from approximately 0.5 mm to approximately 5 mm. In some examples, the height of protrusion 161 of lid 160 can range from approximately 0.5 mm to approximately 9 mm, and the width of protrusion 161 of lid 160 can range from approximately 0.4 mm×0.4 mm to approximately 69 mm×69 mm.

Lid 160 can be made of a material having high heat conduction and radiation. In some examples, lid 160 can comprise a metal, such as aluminum or copper. In some examples, lid 160 can comprise or be referred to as a heatsink, a dissipation plate, a cap cover, an encapsulation part, a protection part, a package, or a body. In some examples, thermal interface material 140 and lid 160 function to dissipate heat generated from electronic component 110 to the outside of electronic device 100. In some examples, additional heat dissipation structures, such as fin structures can be coupled to or formed along the upper side of lid 160.

Lid channel 155 can be positioned between the lower side of lid top 162 and the upper side of lid top 150*a* of lid 150. Lid channel 155 can extend to one or more lateral side(s) of lid 150 and one or more lateral side(s) of lid 160. In some examples, lid channel 155 can comprise lid channel 155' shown in FIGS. 3Ba and 3Ca, lid channel 155" shown in FIGS. 3Bb and 3Cb, or combinations thereof. In lid channel 155' and lid channel 155", the widths of lid channel portions 155*a*' and 155*a*" can be larger than the widths of lid channel portions 155*b*' and 155*b*" and lid channel portion 155*c*", and thus, thermal interface material 140 located within opening 153 can reduce migration to the lateral sides of the lid structure. In some examples, lid channels 155, 155', 155" comprise portions or segments comprising different dimensions. The dimensions of lid channels 155, 155', and 155" can be configured to contain thermal interface material 140 within electronic device 100. In some examples, the dimensions of lid channels 155, 155', and 155" can be selected so that lateral edges of thermal interface material 140 terminate at a desired location within lid channels 155, 155', and 155". In some examples, at least some portions of the outer ends of lid channels 155, 155', and 155" are devoid of thermal interface material 140.

Figure 4C:
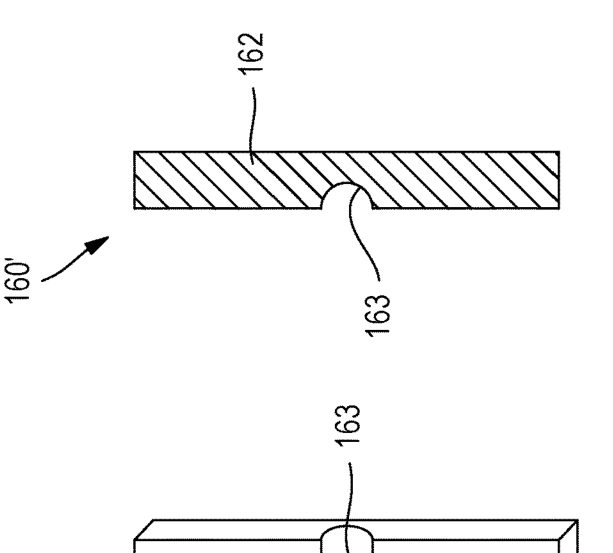
FIG. 4C is a cross-sectional view taken along reference 4C-4C' of FIG. 4B.
Figure 4B:
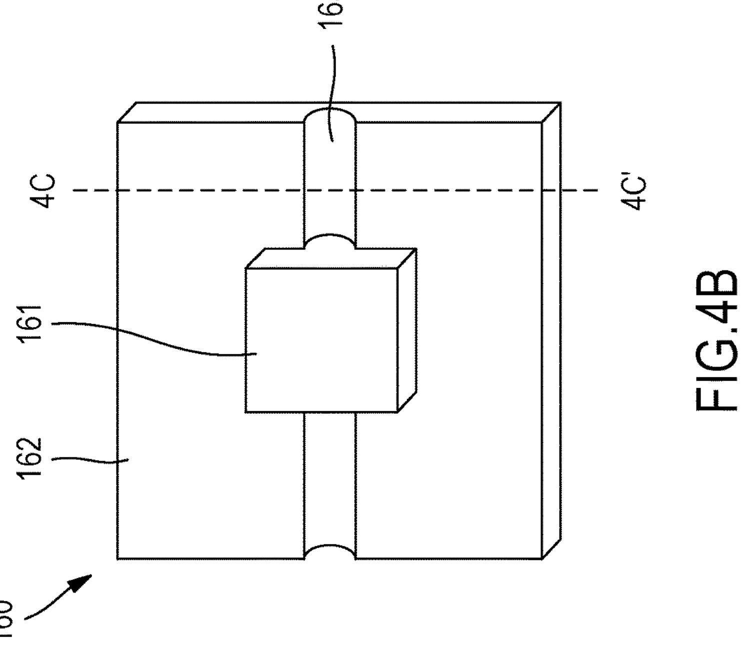
FIGS. 4A and 4B show bottom plan views of example second lids of an electronic device.
Figure 4A:
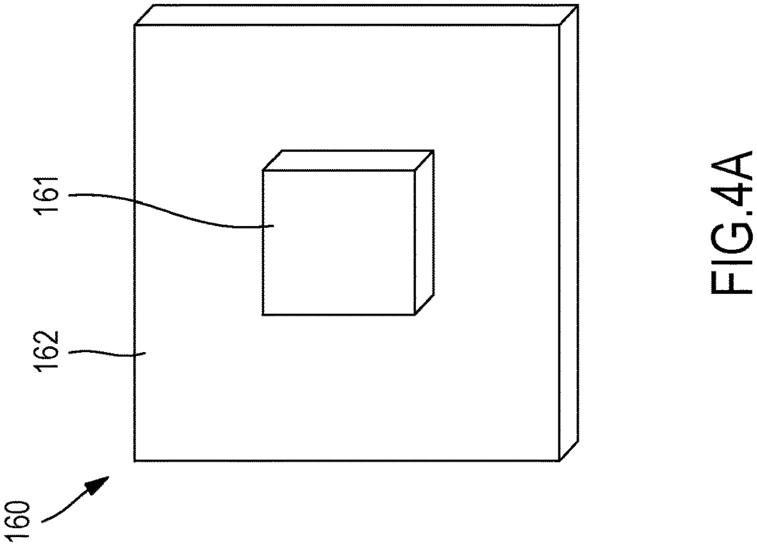

FIG. 4B is a bottom plan view of another example of a lid 160', and FIG. 4C is a cross-sectional view taken along line 4C-4C' in FIG. 4B. Lid 160' can comprise lid channel 163 provided on the lower side of lid top 162. Lid 160' can be similar to lid 160 shown in FIGS. 2D, 2DA, and 4A in terms of lid top 162 and protrusion 161. Lid channel 163 can extend from opposing sides of protrusion 161 to opposing or adjacent lateral sides of lid top 162. In some examples, lid channel 163 can have elements, features, materials, or manufacturing methods similar to or the same as those of lid channel 155 of lid 150. In some examples, lid channel 163 can have elements, features, materials, or manufacturing methods similar to or the same as those of lid channel 155' of lid 150' or lid channel 155" of lid 150".

When lid channel 163 is included in lid 160', the upper side of lid top 150*a* can be absent, devoid, or without a lid channel as shown, for example, in FIG. 3Bc, which is a top plan view of a lid 150". With combined reference to FIGS. 3Bc, 4B, and 4C, when electronic device 100 comprises lid 160', lid 160' can be coupled to lid top 150*a* of lid 150". The upper side of lid top 150*a* of lid 150'" can be a flat plane. Lid 150" can be similar to lid 150 shown in FIGS. 3A, 3B, and 3C in terms of lid top 150*a*, lid side wall 150*b*, and opening 153. Opening 153 can be provided in the center or central portion of lid top 150*a* of lid 150". Lid 150" can be attached to electronic component 110 and substrate 120 through dam structure 151 and attachment material 152. In lid 150'", the upper side of lid top 150*a* can be coupled to the lower side of lid top 162 of lid 160' with attachment material 154. In some examples, attachment material 154 can be provided on the lower side of lid top 162 of lid 160', except for lid channel 163, and can then be coupled to the upper side of lid top 150*a* of lid 150".

In some examples, lid 150 can include a lid channel (for example, lid channels 155, 155', or 155") and lid 160 can include lid channel 163. Lid channels 155 and 163 can be provided to lid 150 or lid 160. In some examples, the lid channel(s) in lid 150 can have similar configurations (shapes, dimensions, locations) to the lid channel(s) in lid 160. In other examples, the lid channel(s) in lid 150 can have different configurations than the lid channel(s) in lid 160.

Figure 2E:
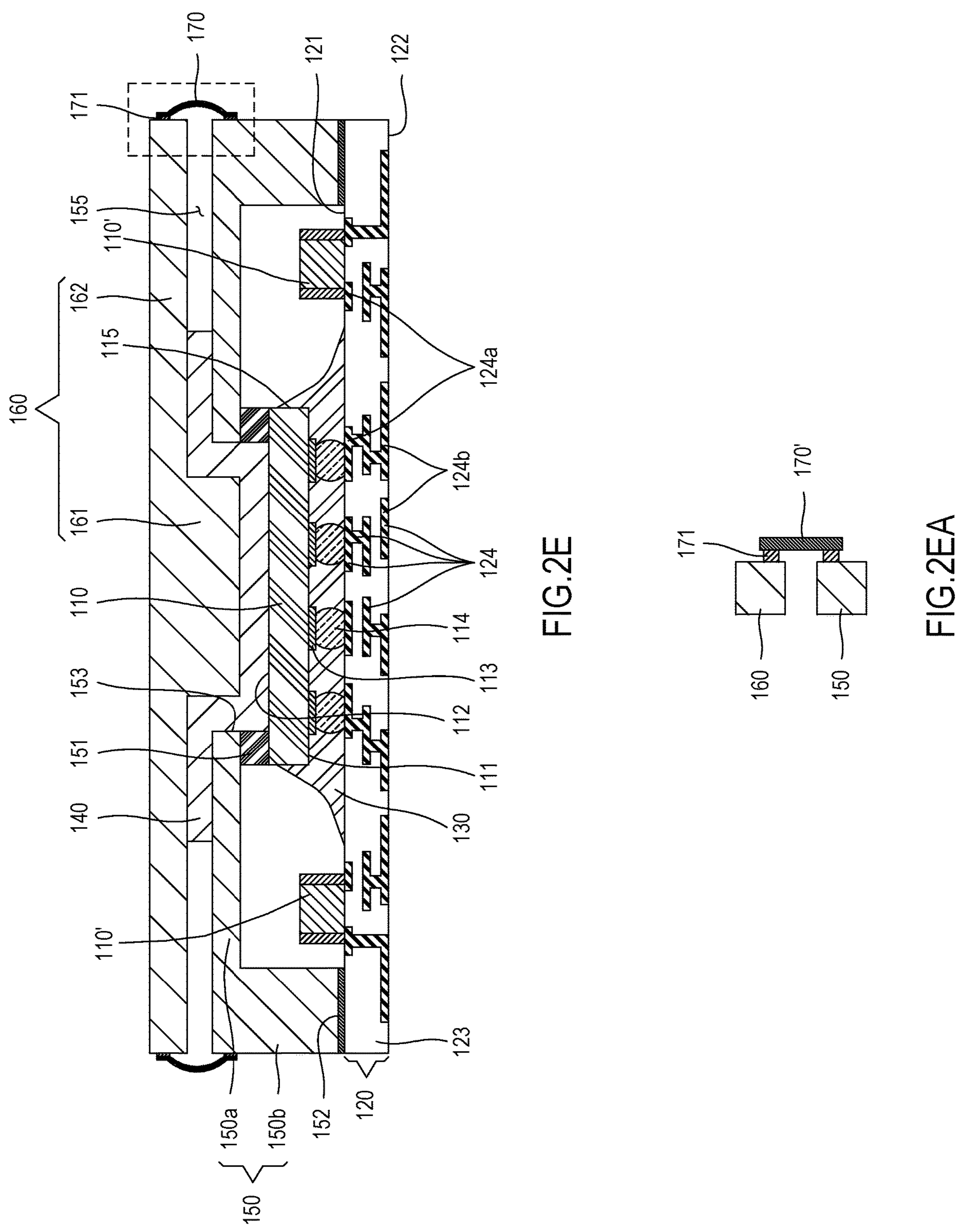
FIG. 2EA shows a cross-sectional view of an example closing member.

FIG. 2E shows electronic device 100 at a later stage of manufacture. In the example shown in FIG. 2E, closing member 170 can be provided to cover lid channel 155 exposed to the lateral side(s) of lid 150 and lid 160. Closing member 170 can also comprise or be referred to as a cap, a cover, or a plug. Closing member 170 can be adhered to the lateral sides of lid 150 and lid 160 through an attachment material 171. Closing member 170 can seal lid channel 155. In some examples, closing member 170 can prevent thermal interface material 140 located in lid channel 155 from leaking to the outside of electronic device 100. In some examples, closing member 170 can be made of an insulating material. For example, closing member 170 can comprise a rubber cap, as shown in FIG. 2E, a polymer membrane film 170', as shown in FIG. 2EA, or other elastically deformable material. The elasticity of closing member 170, 170' can allow closing member 170, 170' to expand or contract (i.e., elastically deform) in response force applied to closing member 170, 170' by fluid (e.g., air) entrapped between TIM 140 and closing member 170, 170'. For example, an expansion or flow of TIM 140 in lid channel 155 can cause a portion of closing member 170 to protrude outwardly away from TIM 140 and the lateral sides of lids 150 and 160. Closing member 170 or 170' can have a thickness ranging from approximately 50 μm to approximately 2000 μm.

Attachment material 171 can be provided in a ring shape along the edge of closing member 170. Attachment material 171 can have elements, features, materials, or manufacturing methods similar to or the same as those of dam structure 151 or attachment material 152.

Figure 2F:
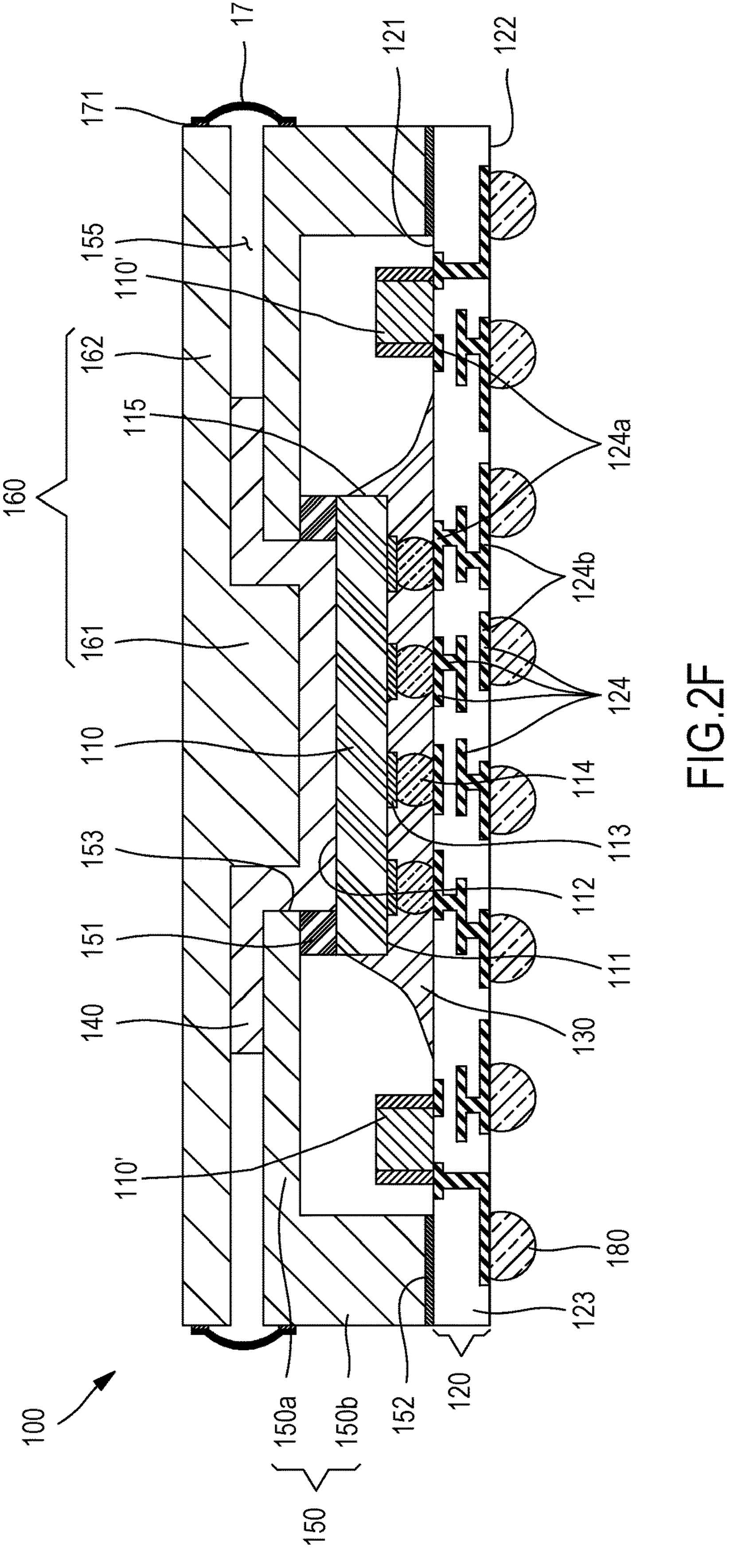

FIG. 2F shows electronic device 100 at a later stage of manufacture. In the example shown in FIG. 2F, external interconnects 180 can be provided on second side 122 of substrate 120.

External interconnects 180 can be coupled to conductive structure 124 exposed from substrate second side 122 of substrate 120. For example, external interconnects 180 can be coupled to substrate outward terminals 124*b* of conductive structure 124. In some examples, external interconnects 180 can comprise or be referred to as solder balls, solder coated metal (e.g., copper) core balls, pillars, pillars with solder caps, or bumps with solder caps. External interconnects 180 can comprise tin (Sn), silver (Ag), lead (Pb), copper (Cu), Sn—Pb, Sn37-Pb, Sn95-Pb, Sn—Pb—Ag, Sn—Cu, Sn—Ag, Sn—Au, Sn—Bi, or Sn—Ag—Cu. In some examples, external interconnects 180 can be provided through a reflow process after forming a conductive material including solder on second side 122 of substrate 120 in a ball drop method. External interconnects 180 can couple electronic device 100 to an external device. In some examples, the thickness of each of external interconnects 180 can range from about 25 μm to about 1000 μm and external interconnects can have a pitch of between about 25 μm to about 1000 μm.

Electronic device 100 can comprise electronic components 110 and 110', substrate 120, underfill 130, thermal interface material 140, lids 150 and 160, closing member 170, and external interconnects 180. Even if distortion or deformation occurs due to a difference in thermal expansion coefficient between electronic component 110 and lids 150 and 160 of electronic device 100, it is possible to prevent thermal interface material 140 from being delaminated or peeled away from electronic component 110 or lids 150 and 160 because thermal interface material 140 is in liquid form. Lid 150 and lid 160, lid 150' and lid 160, lid 150" and lid 160, lid 150" and lid 160', and any other combinations thereof are examples of lid structures.

Figure 5A:
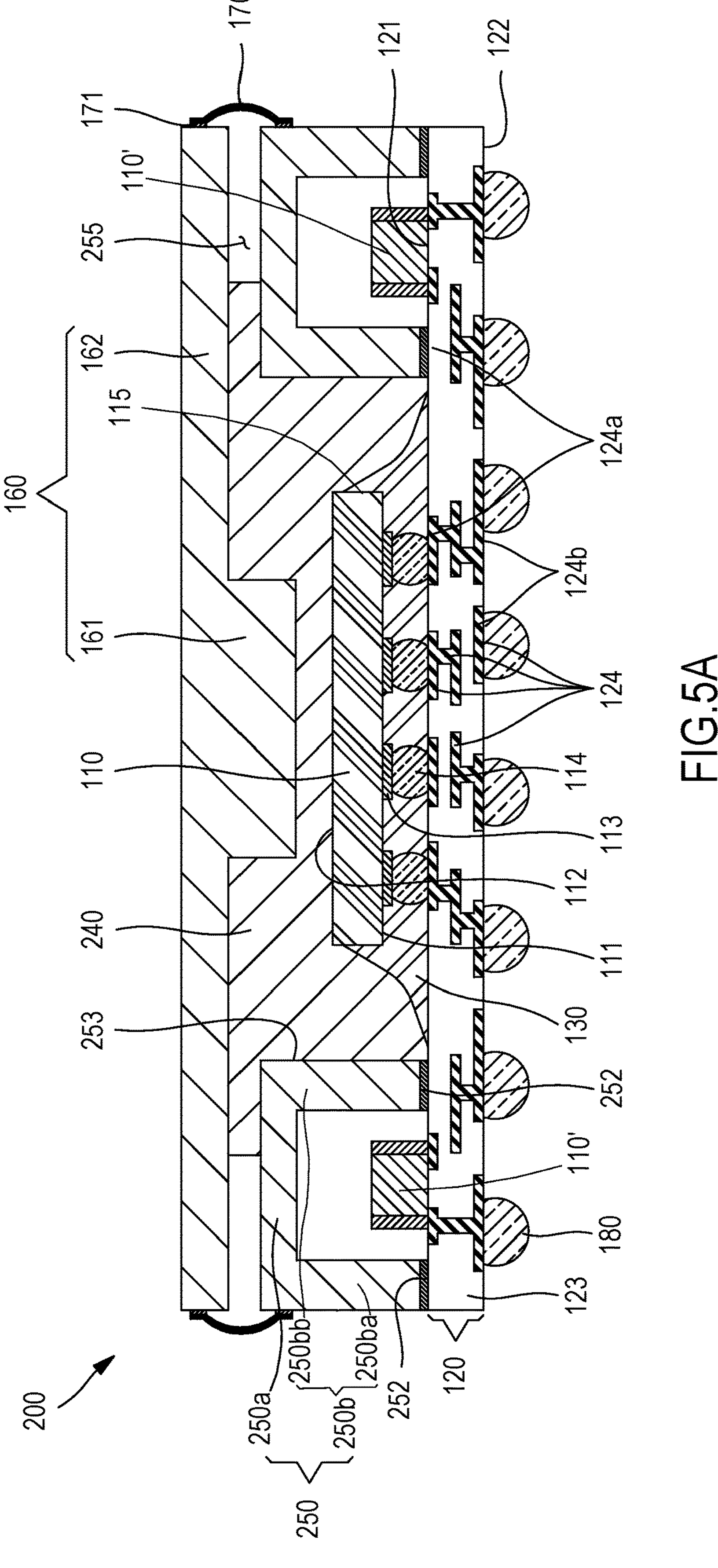
FIGS. 5A and 5B cross-sectional views of an example electronic device.
Figures 5B, 5C:
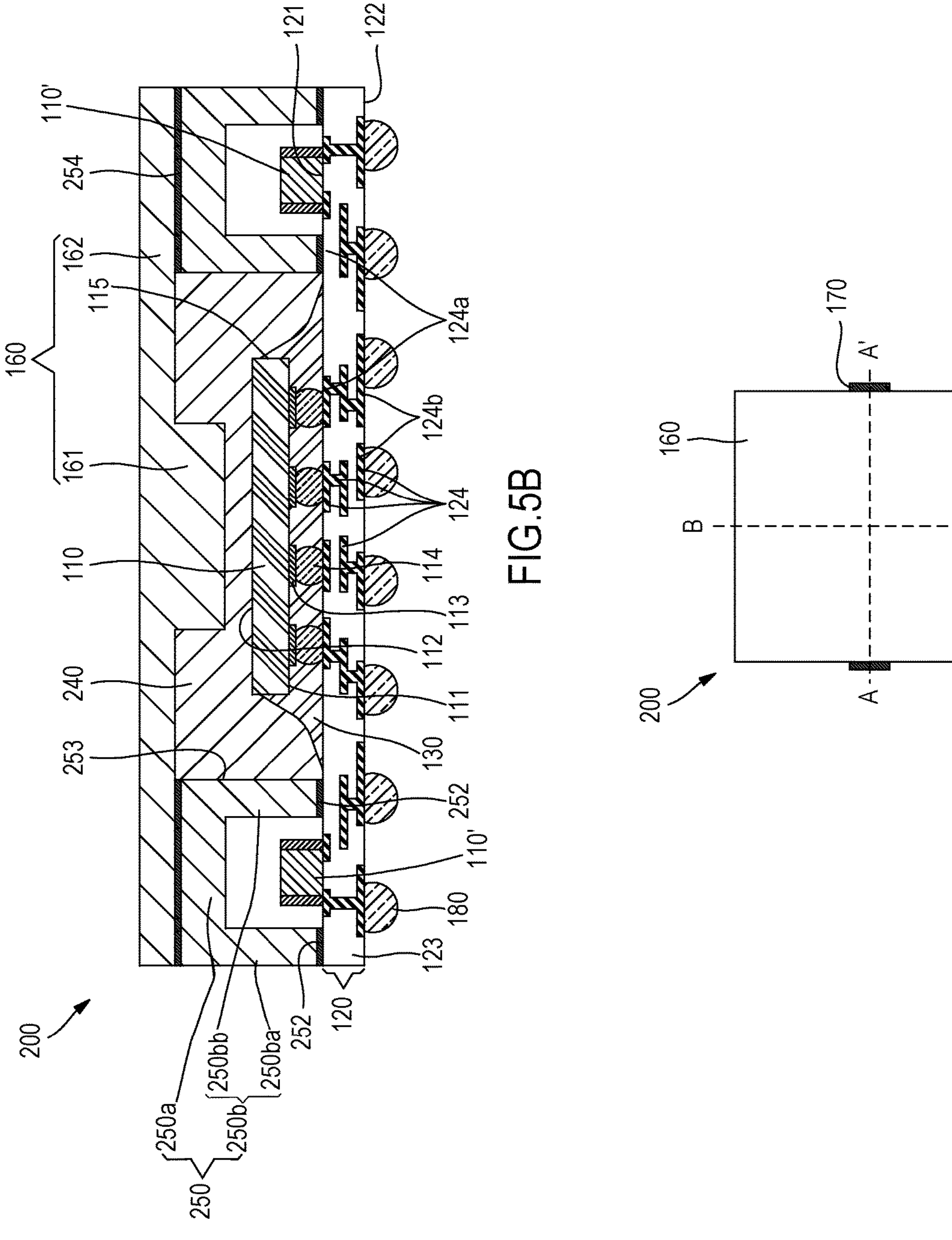
FIG. 5C shows a top view of an example electronic device.
Figure 6B:
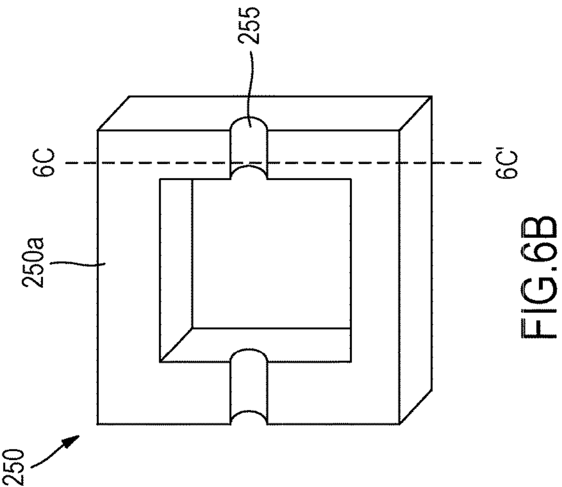
FIGS. 6A, 6B, and 6C show a bottom plan view, a top plan view, and a cross-sectional view respectively of an example first lid of an electronic device.
Figure 6C:
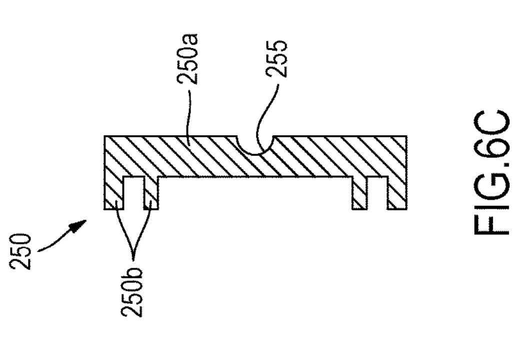
Figure 6A:
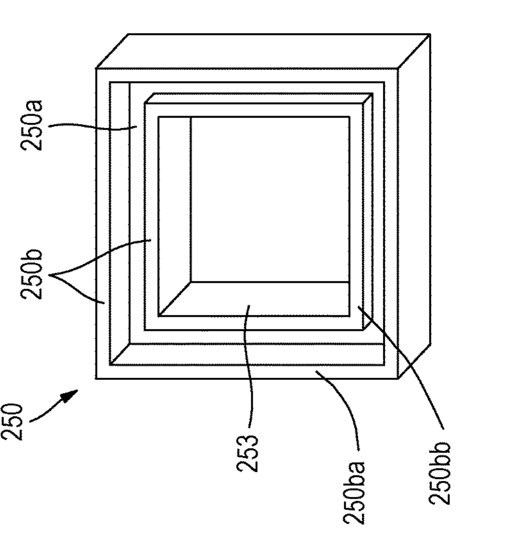
Figure 6B:
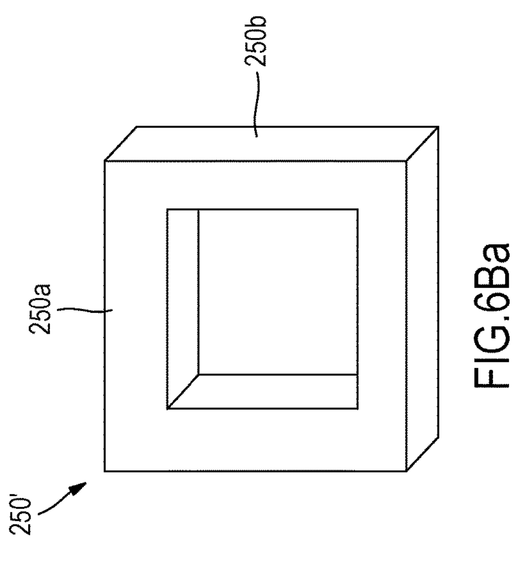

FIGS. 5A and 5B show cross-sectional views and FIG. 5C shows a top view of an example electronic device 200. FIG. 5A is a cross-sectional view taken along line A-A' in FIG. 5C and FIG. 5B is a cross-sectional view taken along line B-B' in FIG. 5C. FIGS. 6A, 6B, and 6C show a bottom plan view, a top plan view, and a cross-sectional view of a lid 250 of electronic device 200. The cross-sectional view of FIG. 6C is taken along reference line C-C' of FIG. 6B.

In the example shown in FIGS. 5A, 5B, and 5C, electronic device 200 can comprise electronic component 110, electronic component(s) 110', substrate 120, underfill 130, thermal interface material 240, lid 250, lid 160, closing member 170, and external interconnects 180. Electronic device 200 can be similar to electronic device 100 and only differences between electronic device 200 and electronic device 100 will be described hereinafter. For example, electronic device 200 comprises a lid 250, which comprises a lid top 250*a*, an opening 253, and side walls 250*b*. Opening 253 can expose second side 112 of electronic component 110 and a portion of first side 121 of substrate 120. In some examples, opening 253 can comprise a rectangular shape. Opening 253 can have an area in a range from about 1.5 mm×1.5 mm to 146 mm×146 mm. Lid top 250*a* can also be referred to as or comprise a lid top plate. Lid 250 can also be referred to as or comprise a first lid.

In some examples, lid top 250*a* can comprise four edges and side wall 250*b* can extend downward from a lower side of lid top 250*a*. In the present example, side wall 250*b* comprises an outer side wall 250*ba* proximate to outer edges of substrate 120 and an inner side wall 250*bb* laterally spaced inward from the outer edges of substrate 120. Inner side wall 250*bb* can be located closer to electronic component 110 as compared to outer side wall 250*ba*. In some examples, inner side wall 250*bb* and lid top 250*a* define opening 253.

In some examples, side wall 250*b* can comprise two concentric ring structures spaced apart from each other to define a cavity or void interposed between outer side wall 250*ba* and inner side wall 250*bb* and below lid top 250*a*. In some examples, the concentric rings can have a square or rectangular shape. In the present example, electronic component 110 can be positioned inside inner side wall 250*bb* and electronic component(s) 110' can be positioned inside the cavity between outer side wall 250*ba* and inner side wall 250*bb*. Inner side wall 250*bb* of lid 250 can be taller than and cover lateral side 115 of electronic component 110. The lower side of outer side wall 250*ba* and the lower side of inner side wall 250*bb* of lid 250 can be coupled to first side 121 of substrate 120 through attachment material 252. Attachment material 252 can have elements, features, materials, or manufacturing methods similar to or the same as those of attachment material 152. Lid 250 can have elements, features, materials, or manufacturing methods similar to or the same as those of lid 150. The thickness of lid top 250*a* and the height outer side wall 250*ba* and inner side wall 250*bb* can be similar to or the same as lid top 150*a* and lid side wall 150*b*, respectively.

Lid 250 can comprise lid channel 255 provided in a downward direction from the top side of lid top 250*a*. Lid channel 255 can have elements, features, materials, or manufacturing methods similar to or the same as those of lid channel 155, lid channel 155', or lid channel 155" shown in FIGS. 3B, 3Ba, and 3Bb.

FIG. 6Ba shows a top plan view of another example a lid 250'. In the present example, lid 250' is provided without, devoid of, or absent a lid channel. In the present example, lid 160' shown in FIGS. 4B and 4C and, which comprises lid channel 163, can be used with lid 250'. In other examples, both lid channels 255 and 163 can be included in the lid structure (e.g., lid 250' and lid 160 together are an example of a lid structure and device 200 can comprise lid 250 and lid 160').

In some examples, attachment material 254 can be provided on the upper side of lid top 250*a* of lid 250. Attachment material 254 can be provided before or after lid 250 is coupled to substrate 120. Attachment material 254 can be provided in an area other than lid channel 255 on lid top 250*a*. Attachment material 254 can have elements, features, materials, or manufacturing methods similar to or the same as those of attachment material 152. Lid 250 and lid 160 together are an example of a lid structure.

Thermal interface material 240 can be provided inside opening 253 of lid 250. Thermal interface material 240 can be in contact with second side 112 of electronic component 110 and inner side wall 250*bb*. Thermal interface material 240 can be in contact with underfill 130. Thermal interface material 240 can be provided to fill the inside of opening 253 of lid 250. In some examples, thermal interface material 240 can contact a portion of first side 121 of substrate between underfill 130 and inner side wall 250*bb*. Inner side wall 250*bb* of lid 250 can prevent thermal interface material 140 from flowing to a region other than electronic component 110, which can reduce or prevent shorts in device 200. In some examples, electronic components 110' are enclosed within the cavities defined by side wall 250*b* and lid top 250*a* and are devoid of thermal interface material 240.

Thermal interface material 240 can be in liquid form. Thermal interface material 240 can be in contact with protrusion 161 or lid top 162 of lid 160. Thermal interface material 240 can have elements, features, materials, or manufacturing methods similar to or the same as those of thermal interface material 140. In some examples, the lid channels illustrated herein can have portions devoid of thermal interface material 240.

FIGS. 1A, 2E, 2EA, 2F, and 5A are examples of electronic devices that comprise one or more closing members, wherein the lid channel comprises a lid channel opening exposed at a lateral side of the lid structure, and the closing member covers or seals the lid channel opening. Also, FIGS. 1A, 2E, 2F, and 5A are examples of methods of providing a first closing member that seals a first portion of the lid channel at a first lateral side of the lid structure and providing a second closing member that seals a second portion of the lid channel at a second lateral side of the lid structure. In addition, FIGS. 1A, 2E, 2F, and FIG. 5A are examples where one or more portions of the lid channels are devoid of the thermal interface material. In some examples, such portions that are devoid of the thermal interface material are proximate to the closing members.

FIGS. 3B, 3Ba, 3Bb, 4B, and 6B are examples of lid structures that comprise lid channels that include a first portion that extends from the opening to a first lateral side of the lid structure and a second portion that extends from the opening to a second lateral side of the lid structure. FIGS. 3B, 3Ba, 4B, and 6B are examples of lid structures where the first lateral side is opposite to the second lateral side. FIG. 3Bb is an example of a lid structure where the first lateral side is adjacent to the second lateral side.

From all of the foregoing, those skilled in the art can appreciate that in an example, the thermal interface material can vertically overlap the component lateral side. In another example, the thermal interface material can contact the underfill. In a further example, the thermal interface material can contact a first side of the substrate or a lid side wall. In a still further example, the first side of the substrate or the lid side wall can be devoid of the thermal interface material. In a further example, the lid channel can comprise segments comprising different widths.

From all of the foregoing, those skilled in the art can appreciate that in an example, a method of manufacturing an electronic device can comprise providing the lid comprising a first lid side wall coupled to the substrate first side; and providing the first lid top coupled to the first lid wall. In another example, a method can comprise providing thermal interface material comprising a liquid and providing the thermal interface material adjacent to the component latera side and the first lid side wall. In further example, a method can include providing a portion of the lid channel devoid of the thermal interface material.

In summary, structures and associated methods that relate to electronic devices with heat dissipation structures are disclosed herein. More particularly, structures and methods have been described that improve the reliability of electronic devices during stress events, such as during thermal stressing. In some examples, lid structures configured to contain liquid thermal interface materials and control the effects of thermal expansion on the thermal interface material during a thermal stress event can be used to reduce warpage, distortion, or bending of the electronic devices. Among other things, this improves the reliability of the electronic devices.

In some examples, the lid structure comprises a lid channel structure and a space or cavity that confines the thermal interface material to a major side of an electronic component. In some examples, the lid structure comprises a lid channel structure and a space or cavity that confines the thermal interface material to a major side of an electronic component, a lateral side of the electronic component, and a portion of a substrate the electronic component is coupled to. In some examples, the thermal interface material can extend into an empty space within the lid channel structure during a stress event. In some examples, the lid channel structure can be sealed to confine the thermal interface material within the electronic device.

The present disclosure includes reference to certain examples; however, it will be understood by those skilled in the art that various changes may be made and equivalents may be substituted without departing from the scope of the disclosure. In addition, modifications may be made to the disclosed examples without departing from the scope of the present disclosure. Therefore, it is intended that the present disclosure not be limited to the examples disclosed, but that the disclosure will include all examples falling within the scope of the appended claims.

What is claimed is:

1. An electronic device, comprising:
a substrate comprising:
a substrate first side;
a substrate second side opposite to the substrate first side; and
a conductive structure;
a first electronic component comprising:
a component first side coupled to the conductive structure at the substrate first side;
a component second side opposite to the component first side; and
a component lateral side connecting the component first side to the component second side;
a lid structure comprising:
a first lid comprising:
a first lid outer sidewall coupled to the substrate; and
a first lid top coupled to the first lid outer sidewall and comprising an opening over the component second side;
a second lid comprising a second lid top attached to the first lid top; and
a lid channel coupled to the opening and comprising a first channel portion extending inward into a first portion of the first lid top, the first channel portion comprising a first distal end that exits from a first lateral side of the first lid outer sidewall, wherein the second lid top covers the lid channel and covers the opening; and
a thermal interface material within the opening and covering at least a portion of the component second side.

2. The electronic device of claim 1, further comprising:
a closing member covering the first distal end of the first channel portion;
wherein:
the closing member comprises a deformable material that expands or contracts in response to fluid force.

3. The electronic device of claim 1, wherein:
the lid channel comprises segments that are coupled together between the opening and the first lateral side as a single channel; and
the segments are arranged in different directions with respect to the opening.

4. The electronic device of claim 1, wherein:
the second lid comprises a protrusion that extends inward from the second lid top into the opening.

5. The electronic device of claim 1, further comprising:
a dam structure coupling the first lid top with the component second side;
wherein:
the thermal interface material is inside the dam structure.

6. The electronic device of claim 1, wherein:
the lid channel comprises:
a second channel portion extending inward into a second portion of the first lid top, the second channel portion comprising a second distal end that exits from a second lateral side of the first lid outer sidewall.

7. The electronic device of claim 6, wherein:
the first lateral side is opposite to the second lateral side.

8. The electronic device of claim 6, wherein:
the first lateral side is adjacent to the second lateral side.

9. The electronic device of claim 1, wherein:
the thermal interface material comprises a liquid; and
a portion of the lid channel is devoid of the thermal interface material.

10. The electronic device of claim 1, wherein:
the thermal interface material extends into at least a portion of the lid channel.

11. The electronic device of claim 2, further comprising:
an attachment material;
wherein:
the closing member is external to the lid channel and is bonded to the first lid outer sidewall with the attachment material.

12. An electronic device, comprising:
a substrate comprising:
a substrate first side;
a substrate second side opposite to the substrate first side; and
a conductive structure;
a first electronic component comprising:
a component first side coupled to the conductive structure at the substrate first side;
a component second side opposite to the component first side; and
a component lateral side connecting the component first side to the component second side;

a lid structure comprising:

a first lid comprising a first lid top and a first lid outer sidewall, wherein the first lid outer sidewall is coupled to the substrate first side, and wherein the first lid top is coupled to the first lid outer sidewall and comprises an opening;

a second lid comprising a second lid top attached to the first lid top; and a lid channel in one or more of the first lid or the second lid, wherein the lid channel comprises a first channel portion comprising a first proximate end coupled to the opening and a first distal end that exits at a first lateral side of the lid structure, and wherein the second lid top covers the opening and the lid channel;

a thermal interface material within the opening; and a first closing member coupled to the first lateral side of the lid structure and covering the first distal end of the first channel portion, wherein the first closing member comprises a deformable material that expands or contracts in response to fluid force.

13. The electronic device of claim 12, further comprising:

a dam structure coupled to the first lid top and the first electronic component; and an attachment material;

wherein:

the second lid top is bonded to the first lid top with the attachment material;

the first lid top is attached to the dam structure;

the first closing member is attached to the first lateral side and is external to the distal end of the first channel portion;

the thermal interface material comprises a liquid;

the dam structure laterally confines the thermal interface material; and the second lid comprises a protrusion extending inward from the second lid top that is, at least, partially within the opening.

14. The electronic device of claim 12, wherein:

the first lid comprises a first lid inner sidewall laterally inset with respect to the first lid outer sidewall and coupled to the substrate first side such that the first lid inner sidewall is laterally separated from the component lateral side and the first lid is devoid of contact with the first electronic component; and the first lid top is coupled to the first lid inner sidewall.

15. The electronic device of claim 14, wherein:

the thermal interface material comprises a liquid; and the thermal interface material contacts the component lateral side and the first lid inner sidewall.

16. The electronic device of claim 12, further comprising:

a second closing member;

wherein:

the lid structure comprises a second lateral side that is different than the first lateral side;

the lid channel comprises:

a second channel portion comprising a second proximate end coupled to the opening and a second distal end that exits at the second lateral side;

the second closing member is coupled to the second lateral side of the lid structure and covers the second distal end of the second channel portion; and the second closing member comprises the deformable material that expands or contracts in response to fluid force.

17. The electronic device of claim 12, wherein the first channel portion comprises:

a first channel segment comprising the first proximate end coupled to the opening and laterally extending in a first direction; and a second channel segment connected to the first channel segment and comprising the first distal end extending in a second direction that is perpendicular to the first direction.

18. A method of manufacturing an electronic device, comprising:

providing a substrate comprising:

a substrate first side;

a substrate second side opposite to the substrate first side; and a conductive structure;

providing a first electronic component comprising:

a component first side coupled to the conductive structure at the substrate first side;

a component second side opposite to the component first side; and a component lateral side connecting the component first side to the component second side;

providing a first lid comprising a first lid top, a lid channel extending inward into the first lid from the first lid top, and a first lid outer sidewall, wherein the first lid outer sidewall is coupled to the substrate first side, and wherein the first lid top comprises an opening, and wherein the lid channel comprises a first channel portion comprising a first proximate end coupled to the opening and a first distal end that exits at a first lateral side of the first lid outer sidewall, and wherein the component second side is exposed through the opening over the component second side;

providing a second lid comprising a second lid top; coupled to the first lid top;

attaching the second lid top to the first lid top, wherein the second lid top covers the lid channel and the opening;

providing a thermal interface material within the opening; and providing a first closing member coupled to the first lid outer sidewall and the second lid, wherein the first closing member covers the first distal end of the first channel portion, and wherein the first closing member comprises a deformable material that expands or contracts in response to fluid force.

19. The method of claim 18, further comprising:

providing a dam structure between the first lid top and the first electronic component;

wherein:

providing the thermal interface material comprises providing a liquid thermal interface material;

the dam structure laterally confines the thermal interface material; and providing the second lid comprises locating a protrusion of the second lid, at least, partially within the opening.

20. The method of claim 18, wherein:

providing the first lid comprises providing the first channel portion comprising:

a first channel segment comprising the first proximate end coupled to the opening and laterally extending in a first direction; and a second channel segment connected to the first channel segment and comprising the first distal end extending in a second direction that is perpendicular to the first direction.

* * * * *